(12) United States Patent
Ogata et al.

(10) Patent No.: US 9,484,230 B2
(45) Date of Patent: Nov. 1, 2016

(54) SUBSTRATE LIQUID PROCESSING APPARATUS

(75) Inventors: Nobuhiro Ogata, Koshi (JP); Shuichi Nagamine, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 1053 days.

(21) Appl. No.: 13/151,610

(22) Filed: Jun. 2, 2011

(65) Prior Publication Data

US 2011/0297192 A1 Dec. 8, 2011

(30) Foreign Application Priority Data

Jun. 3, 2010 (JP) ................................ 2010-128172
Dec. 17, 2010 (JP) ................................ 2010-281772

(51) Int. Cl.
| | | |
|---|---|---|
| B08B 3/00 | (2006.01) | |
| H01L 21/00 | (2006.01) | |
| H01L 21/67 | (2006.01) | |

(52) U.S. Cl.
CPC ............................. H01L 21/67051 (2013.01)

(58) Field of Classification Search
CPC ................... H01L 21/67051; H01L 21/6715; H01L 21/6708; H01L 21/02041
USPC ........................................................ 134/183
See application file for complete search history.

(56) References Cited

U.S. PATENT DOCUMENTS

| | | | | |
|---|---|---|---|---|
| 2003/0079835 A1* | 5/2003 | Kajino | ..................... | C03C 15/00 156/345.11 |
| 2004/0050491 A1* | 3/2004 | Miya | ..................... | B08B 17/00 156/345.11 |
| 2004/0180142 A1* | 9/2004 | Kobayashi et al. | .......... | 427/240 |
| 2004/0226582 A1 | 11/2004 | Satoshi et al. | | |
| 2006/0046413 A1* | 3/2006 | Edamoto | ....................... | 438/366 |

(Continued)

FOREIGN PATENT DOCUMENTS

| | | | |
|---|---|---|---|
| JP | 10-323633 | A1 | 12/1998 |
| JP | 2000-183010 | A1 | 6/2000 |

(Continued)

OTHER PUBLICATIONS

Japanese Office Action from a corresponding Japanese patent application bearing a mailing date of Oct. 2, 2012.

(Continued)

*Primary Examiner* — Michael Kornakov
*Assistant Examiner* — Marc Lorenzi
(74) *Attorney, Agent, or Firm* — Burr & Brown, PLLC

(57) ABSTRACT

A substrate liquid processing apparatus of the present invention includes a process-liquid supply unit selectively supplying a plurality of types of process-liquids to the substrate held by a substrate holding table, first and second guide cups which are disposed in this order from the top and are configured to respectively guide downward the process-liquid scattering from the rotating substrate while being held by the substrate holding table; and a position adjustment mechanism adjusting a positional relationship between the first and second guide cups and the substrate holding table. A first process-liquid recovery tank is provided at a lower area of the first and second guide cups and recovers the process-liquid guided by the first guide cup. A second process-liquid recovery tank is provided at the inner peripheral side of the first process-liquid recovery tank and recovers the process-liquid guided by the second guide cup.

12 Claims, 9 Drawing Sheets

(56) References Cited

U.S. PATENT DOCUMENTS

| | | |
|---|---|---|
| 2006/0222315 A1 | 10/2006 | Yoshida |
| 2007/0022948 A1* | 2/2007 | Rose et al. .................. 118/52 |
| 2007/0163711 A1 | 7/2007 | Koo et al. |
| 2007/0175500 A1* | 8/2007 | Hohenwarter ............ 134/149 |
| 2009/0084409 A1* | 4/2009 | Okura .................. B08B 3/02 134/21 |
| 2010/0032097 A1* | 2/2010 | Ohashi ................. 156/345.55 |

FOREIGN PATENT DOCUMENTS

| | | |
|---|---|---|
| JP | 2001-267278 | 9/2001 |
| JP | 2002-313771 | 10/2002 |
| JP | 2004-158482 A1 | 6/2004 |
| JP | 2004-223322 | 8/2004 |
| JP | 2001-335956 A1 | 11/2004 |
| JP | 2006-286832 A1 | 10/2006 |
| JP | 2007-088398 | 4/2007 |
| JP | 2007-189232 A1 | 7/2007 |
| JP | 2007-311446 A1 | 11/2007 |
| JP | 2008-129378 | 6/2008 |
| JP | 2009-231710 | 10/2009 |
| JP | 2010-177372 A1 | 8/2010 |

OTHER PUBLICATIONS

U.S. Appl. No. 13/151,577, filed Jun. 2, 2011, Ogata et al.
U.S. Appl. No. 13/151,665, filed Jun. 2, 2011, Ogata et al.
Japanese Office Action dated Jan. 18, 2013.
Japanese Office Action dated Jun. 28, 2013.

* cited by examiner

SUBSTRATE LIQUID PROCESSING APPARATUS

CROSS REFERENCE TO RELATED APPLICATIONS

This application is based upon and claims the benefit of priority from the prior Japanese Patent Application No. 2010-128172, filed on Jun. 3, 2010 and Japanese Patent Application No. 2010-281772, filed on Dec. 17, 2010; the entire contents of which are incorporated herein by reference.

FIELD OF THE INVENTION

The present invention relates to a substrate liquid processing apparatus for processing a substrate with a process-liquid.

BACKGROUND ART

In the process of manufacturing semiconductor products or flat-panel displays (FPDs), a liquid process has been frequently used which supplies a process-liquid to a semiconductor wafer or a glass substrate as a substrate to be processed. Examples of such a process include a cleaning process of removing particles, or contaminants adhering to the substrate and the like.

As a liquid processing apparatus performing the liquid process, there have been known a plurality of single-wafer-type processing units, each of which holds a substrate such as a semiconductor wafer with a spinning chuck and performs a process on the substrate by supplying a process-liquid to the front or rear surface of the rotating substrate.

The process-liquid supplied to the substrate throws off from the rotating substrate and is changed into mist scattering around a substrate placement table. As a mechanism recovering the mist, Japanese Patent Application Laid-Open (JP-A) No. 2000-183010 discloses a chemical liquid recovery cup and a rinse liquid recovery cup.

As shown in FIG. 12, the existing mechanism has a configuration in which a chemical liquid recovery cup 215 and a rinse liquid recovery cup 216 are segmented by an intermediate cup wall 230 and the intermediate cup wall 230 is configured to be able to be moved up and down by an air cylinder 232.

When the air cylinder 232 contracts so that the intermediate cup wall 230 is located at the down position (the state of FIG. 12), an opening 215*a* of the chemical liquid recovery cup 215 increases in size so that it faces a peripheral edge of a substrate W on a spinning chuck 211. In this state, a chemical liquid process is performed, and the chemical liquid (and mist thereof) throwing off from the substrate W is recovered in the chemical liquid recovery cup 215.

On the other hand, when the air cylinder 232 expands so that the intermediate cup wall 230 is located at the up position, an opening 216*a* of the rinse liquid recovery cup 216 increases in size so that it faces the peripheral edge of the substrate W on the spinning chuck 211. In this state, a rinse liquid process is performed, and the rinse liquid (and mist thereof) throwing off from the substrate W is recovered in the rinse liquid recovery cup 216.

SUMMARY OF THE INVENTION

However, in the mist recovery mechanism described by referring to FIG. 12, the mist inside each cup structure is liquefied, so that the liquid is temporarily stored inside the cup structure. Therefore, there is a problem that the liquid once liquefied easily changes into mist again due to an air stream generated with the rotation of a rotating member.

The present invention is made in view of such circumstances, and an object thereof is to provide a substrate liquid processing apparatus that suppresses change of a liquid which is once liquefied into mist again.

The present invention provides a substrate liquid processing apparatus comprising: a substrate holding table configured to hold a substrate; a rotary driving unit configured to rotate the substrate holding table; a process-liquid supply unit configured to selectively supply a plurality of types of process-liquids to the substrate held by the substrate holding table; first and second guide cups which are provided around the substrate holding table and are disposed in this order from the top, the first and second guide cups being configured to respectively guide downward the process-liquid scattering from the rotating substrate while being held by the substrate holding table; a position adjustment mechanism configured to adjust a positional relationship between the first and second guide cups and the substrate holding table; a first process-liquid recovery tank provided at a lower area of the first and second guide cups, the first process-liquid recovery tank being configured to recover the process-liquid guided by the first guide cup; and a second process-liquid recovery tank provided at an inner peripheral side of the first process-liquid recovery tank, the second process-liquid recovery tank being configured to recover the process-liquid guided by the second guide cup.

According to the present invention, a liquid once liquefied can be suppressed from being changed into mist again.

DETAILED DESCRIPTION OF THE INVENTION

Figure 1:
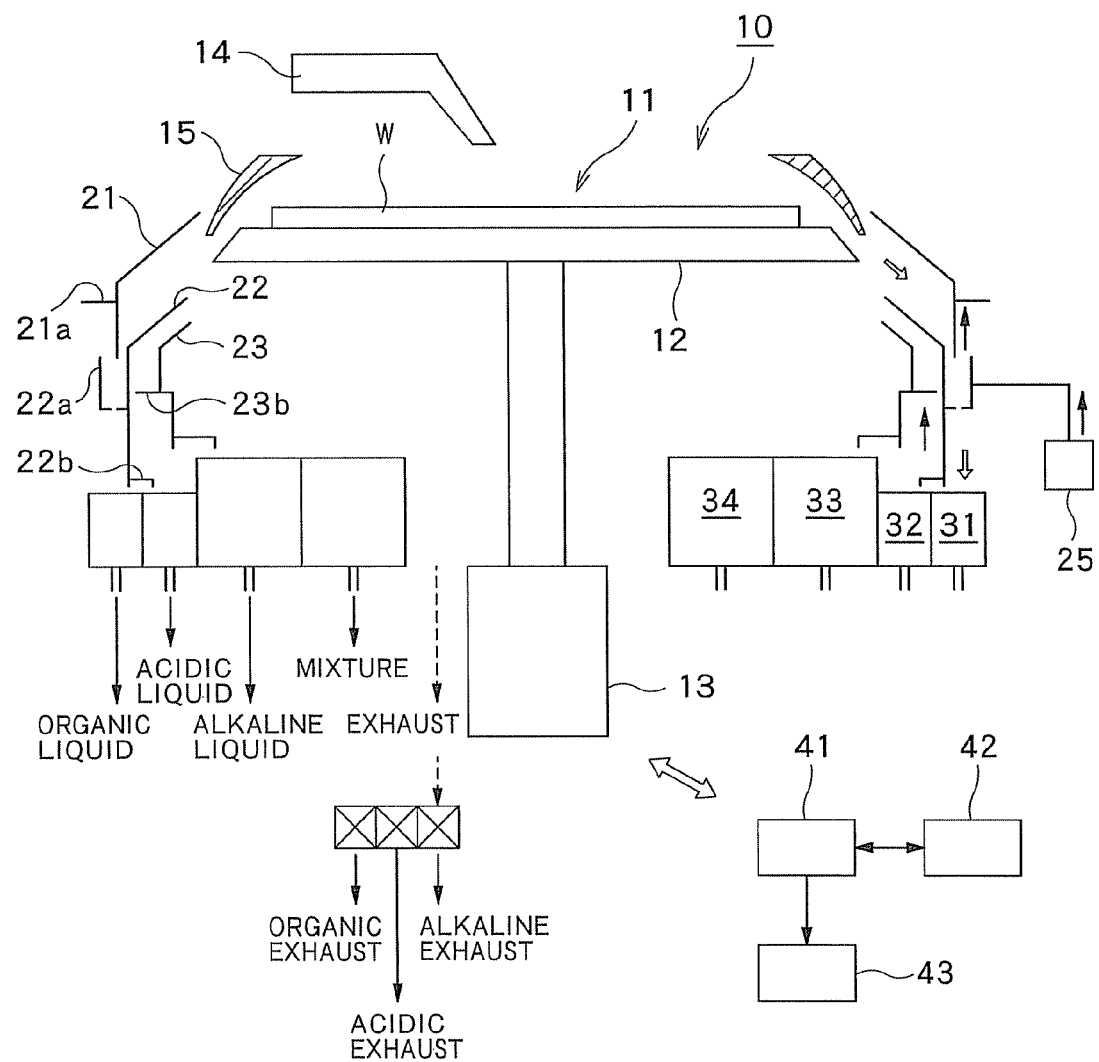
FIG. 1 is a cross-sectional view schematically illustrating the configuration of a liquid processing apparatus in a first recovery state according to a first embodiment of the present invention.

Embodiment of a substrate liquid processing apparatus according to the present invention described above will be described.

In the substrate liquid processing apparatus according to the embodiment of the present invention, it is preferable that the above substrate liquid processing apparatus further comprises a guide member provided at the lower end portion of the second guide cup, the guide member being configured to guide the process-liquid from the first guide cup to the first process-liquid recovery tank and guide the process-liquid from the second guide cup to the second process-liquid recovery tank.

In addition, in the substrate liquid processing apparatus according to the embodiment of the present invention, it is preferable that the guide member includes a guide member body, an outer peripheral wall portion extending downward from the guide member body, and an inner peripheral wall portion provided at the inner peripheral side more than the outer peripheral wall portion and extending downward from the guide member body, and that the outer peripheral wall portion is disposed at a position corresponding to the first process-liquid recovery tank, and the inner peripheral wall portion is disposed at a position corresponding to the second process-liquid recovery tank.

In addition, in the substrate liquid processing apparatus according to the embodiment of the present invention, it is preferable that the position adjustment mechanism is configured to move up and down the second guide cup with respect to the first guide cup, that the inner peripheral wall portion extends downward more than the outer peripheral wall portion, and that the lower end portion of the inner peripheral wall portion is inserted into the second process-liquid recovery tank when the process-liquid is guided by the second guide cup.

In addition, in the substrate liquid processing apparatus according to the embodiment of the present invention, it is preferable that the first guide cup includes a first guide cup body and a downward extension portion extending downward from the inner peripheral end portion of the first guide cup body, and that the downward extension portion of the first guide cup closes, an opening of the first guide cup when the process-liquid is guided by the second guide cup.

In addition, in the substrate liquid processing apparatus according to the embodiment of the present invention, it is preferable that the above substrate liquid processing apparatus further comprises: a third guide cup provided below the second guide cup, the third guide cup being configured to guide the process-liquid scattering from the rotating substrate while being held by the substrate holding table; a third process-liquid recovery tank provided at the inner peripheral side of the second process-liquid recovery tank, the third process-liquid recovery tank being configured to recover the process-liquid guided by the third guide cup; and a defining wall configured to define a passage from the second guide cup to the second process-liquid recovery tank and a passage from the third guide cup to the third process-liquid recovery tank.

In addition, in the substrate liquid processing apparatus according to the embodiment of the present invention, it is preferable that the third guide cup is configured to be moveable up and down together with the second guide cup, and that when the process-liquid is guided by the third guide cup, a gap between the first guide cup and the second guide cup is blocked, and the downward extension portion of the first guide cup closes an opening of the second guide cup.

In addition, in the substrate liquid processing apparatus according to the embodiment of the present invention, it is preferable that the above substrate liquid processing apparatus further comprises an exhaust member provided between the first process-liquid recovery tank and the second process-liquid recovery tank, the exhaust member being configured to discharge an atmosphere around the substrate via the first guide cup and the second guide cup.

In addition, in the substrate liquid processing apparatus according to the embodiment of the present invention, it is preferable that the above substrate liquid processing apparatus further comprises: a third guide cup provided below the second guide cup, the third guide cup being configured to guide the process-liquid scattering from the rotating substrate while being held by the substrate holding table; a third process-liquid recovery tank provided at the inner peripheral side of the second process-liquid recovery tank, the third process-liquid recovery tank being configured to recover the process-liquid guided by the third guide cup; and a defining wall configured to define a passage from the second guide cup to the second process-liquid recovery tank and a passage from the third guide cup to the third process-liquid recovery tank.

In addition, in the substrate liquid processing apparatus according to the embodiment of the present invention, it is preferable that the above substrate liquid processing apparatus further comprises a second exhaust member provided at the inner peripheral side of the third process-liquid recovery tank, the second exhaust member being configured to discharge the atmosphere around the substrate via the third guide cup.

In addition, in the substrate liquid processing apparatus according to the embodiment of the present invention, it is preferable that the first process-liquid recovery tank, the exhaust member, the second process-liquid recovery tank, and the third process-liquid recovery tank have an annular planar cross-section and are coaxially provided.

(First Embodiment)

Hereinafter, an embodiment of the present invention will be described by referring to the accompanying drawings in detail. The present invention may be typically applied to a process of cleaning a semiconductor wafer (an example of an object to be processed) and particularly, a process using a chemical liquid (referred to a chemical liquid process).

As shown in FIG. 1, a liquid processing apparatus 10 is a single-wafer-type substrate liquid processing apparatus that includes a substrate processing chamber 11 in which a substrate is loaded and unloaded one by one and is processed. The substrate process chamber 11 is provided with, for example, a placement table 12 on which a substrate such as a semiconductor wafer is placed. The placement table 12 is configured to rotate within a horizontal plane by a rotary motor (which is an example of a rotary driving unit) 13.

Further, the substrate process chamber 11 is provided with a nozzle (which is an example of a liquid supply unit) 14 that supplies various process-liquids onto the upper surface of the substrate. The nozzle 14 is configured to be selectively connected to, for example, a supply source (not shown) for various process-liquids. Then, a mist guide cup 15 is provided around the placement table 12 to guide the scattering process-liquid or mist thereof. Although the mist guide cup 15 is a substantially annular member where the lower opening end is larger in diameter than the upper opening end and the vertical cross-section has an upward convex curve.

An upper liquid guide cup 21, a central liquid guide cup 22, and a lower liquid guide cup 23 are disposed in this order from the top around the mist guide cup 15 to guide the process-liquid guided by the mist guide cup 15 downward.

In the embodiment, the upper liquid guide cup 21 is provided so that the edge thereof (the inner peripheral edge) near the mist guide cup 15 is located above the peripheral edge area of the mist guide cup 15. The upper liquid guide cup 21 schematically includes a sloped portion having a truncated cone shape and a vertical portion extending downward from the outer peripheral end of the sloped portion.

Further, the central liquid guide cup 22 is provided so that the edge thereof near the mist guide cup 15 is movable in the vertical direction with respect to the peripheral edge area of the mist guide cup 15, in a range from the upper side to the lower side thereof. An up-down movement cylinder 25 is connected to the central liquid guide cup 22 to move up and down the central liquid guide cup (above all, a driving mechanism that moves up and down the central liquid guide cup 22 is not limited to the up-down movement cylinder 25, but may be a driving mechanism such as a motor). The central liquid guide cup 22 also schematically includes a sloped portion having a truncated cone shape and a vertical portion extending downward from the outer peripheral end of the sloped portion.

Then, furthermore, the lower liquid guide cup 23 is provided so that the edge thereof near the mist guide cup 15 is movable in the vertical direction with respect to the peripheral edge area of the mist guide cup 15 in a range from the upper side to the lower side thereof. The lower liquid guide cup 23 also schematically includes a sloped portion having a truncated cone shape and a vertical portion extending downward from the outer peripheral end of the sloped portion.

Figure 2:
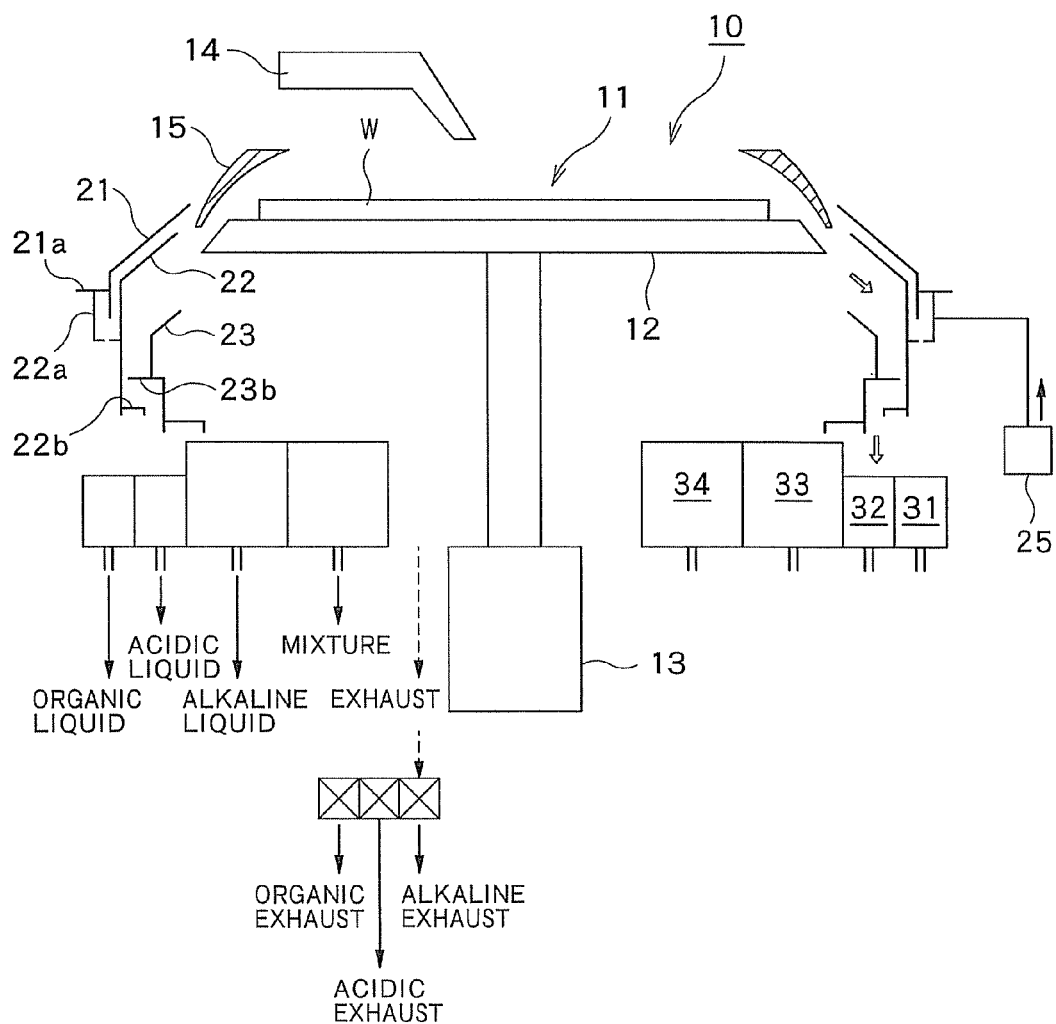
FIG. 2 is a cross-sectional view schematically illustrating the configuration of the liquid processing apparatus in a second recovery state according to the first embodiment of the present invention.
Figure 3:
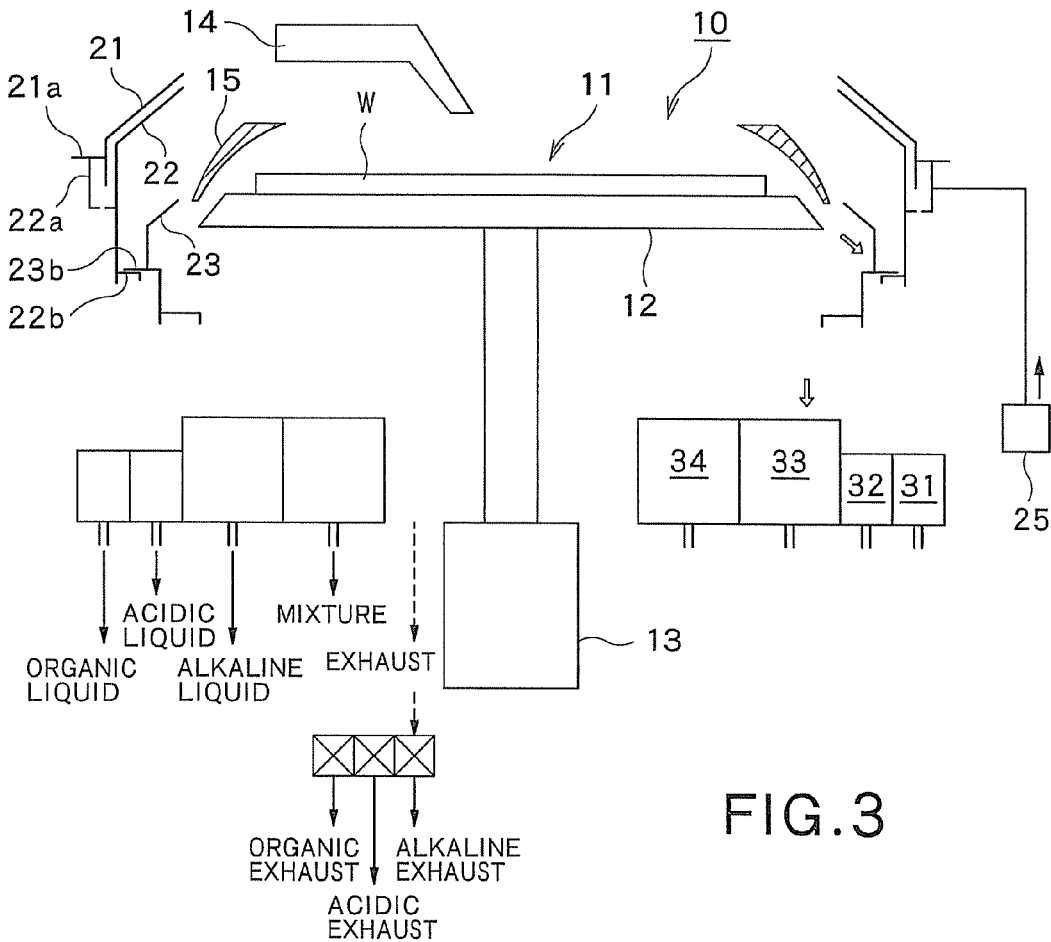
FIG. 3 is a cross-sectional view schematically illustrating the configuration of the liquid processing apparatus in a third recovery state according to the first embodiment of the present invention.

The central liquid guide cup 22 in the state of FIG. 1 is positioned at the lowest position among three states of FIGS. 1 to 3 by the up-down movement cylinder 25. This state corresponds to a state of FIG. 4 to be specifically described later. In this state, the upper liquid guide cup 21 is supported by a support protrusion 29s (refer to FIG. 4) provided in the substrate process chamber 11 from the underside thereof, that is, the upper liquid guide cup 21 is not supported by the central liquid guide cup 22. Further, the lower liquid guide cup 23 is also supported by a support protrusion 28s formed in a member 28 fixed to the substrate process chamber 11, that is, the lower liquid guide cup 23 is not supported by the central liquid guide cup 22.

In the embodiment, the upper liquid guide cup 21 is also movable in the vertical direction. Specifically, the upper liquid guide cup 21 includes an outer flange 21a which is provided at the outer peripheral wall thereof, and the central liquid guide cup 22 includes an outer peripheral contact portion 22a which may support the outer flange 21a of the upper liquid guide cup 21 from the lower side thereof. When the central liquid guide cup 22 is moved in the vertical direction by the up-down movement cylinder 25 in the state where the outer peripheral contact portion 22a of the central liquid guide cup 22 supports the outer flange 21a of the upper liquid guide cup 21 from the lower side thereof, the upper liquid guide cup 21 is also moved in the vertical direction.

That is, the central liquid guide cup 22 moves in the vertical direction independently of the upper liquid guide cup 21 in a partial range of a vertical movement range, and moves in the vertical direction together with the upper liquid guide cup 21 in another partial range.

By adopting such a configuration, the upper liquid guide cup 21 may be also moved up and down by the power of the up-down movement cylinder 25 that moves up and down the central liquid guide cup 22. That is, the driving system has a simple structure.

Above all, the embodiment of employing the contact between the outer flange 21a and the outer peripheral contact portion 22a is merely an example. The upper liquid guide cup 21 and the central liquid guide cup 22 may all be moved in the vertical direction by an arbitrary portion of the upper liquid guide cup 21 and an arbitrary portion of the central liquid guide cup 22.

Further, the lower liquid guide cup 23 includes an outer flange 23b which is provided at the outer peripheral wall thereof, and the central liquid guide cup 22 includes an inner peripheral contact portion 22b which supports the outer flange 23b of the lower liquid guide cup 23 from the lower side thereof. When the central liquid guide cup 22 is moved in the vertical direction by the up-down movement cylinder 25 in the state where the inner peripheral contact portion 22b of the central liquid guide cup 22 supports the outer flange 23b of the lower liquid guide cup 23 from the lower side thereof, the lower liquid guide cup 23 is also moved in the vertical direction.

That is, the central liquid guide cup 22 moves in the vertical direction independently of the lower liquid guide cup 23 in a partial range the vertical movement range, and moves in the vertical direction together with the lower liquid guide cup 23 in another partial range.

By adopting such a configuration, the lower liquid guide cup 23 may be also moved up and down by the power of the up-down movement cylinder 25 that moves up and down the central liquid guide cup 22. That is, the driving system has a simple structure.

Above all, the embodiment of employing the contact between the outer flange 23b and the inner peripheral contact portion 22b is merely an example. The lower liquid guide cup 23 and the central liquid guide cup 22 may all be moved in the vertical direction by using an arbitrary portion of the lower liquid guide cup 23 and an arbitrary portion of the central liquid guide cup 22.

That is, in the embodiment, the, central liquid guide cup 22 is moved up and down independently of the upper liquid guide cup 21 and the lower liquid guide cup 23 in a first partial range of the up-down movement range of the central liquid guide cup 22. The central liquid guide cup 22 is moved up and down together with the upper liquid guide cup 21 in a second partial range, and is moved up and down together with the upper liquid guide cup 21 and the lower liquid guide cup 23 in a third partial range.

When a first recovery state (FIG. 1) to be described later changes to a second recovery state (FIG. 2), first, the central liquid guide cup 22 is moved upward by the up-down movement cylinder 25 independently of the upper liquid guide cup 21 and the lower liquid guide cup 23 (a first partial range of the upward movement range). Subsequently, the outer peripheral contact portion 22a of the central liquid guide cup 22 supports the underside of the outer flange 21a of the upper liquid guide cup 21, and the central liquid guide cup 22 moves upward together with the upper liquid guide cup 21 (a second partial range), so that it reaches the state shown in FIG. 2.

Further, when the second recovery state (FIG. 2) changes to a third recovery state (FIG. 3), first, the central liquid guide cup 22 is moved upward by the up-down movement cylinder 25 together with the upper liquid guide cup 21 (the second range). Subsequently, the inner peripheral contact portion 22b of the central liquid guide cup 22 supports the outer flange 23b of the lower liquid guide cup 23 from the lower side thereof, and the central liquid guide cup 22 moves upward together with the upper liquid guide cup 21 and the lower liquid guide cup 23 (the third range), so that it reaches the state shown in FIG. 3.

When the third recovery state changes to the first recovery state, the liquid processing apparatus may be returned to the state shown in FIG. 1 via the third range, the second range, and the first range described above by moving the central liquid guide cup 22 downward.

Figure 5:
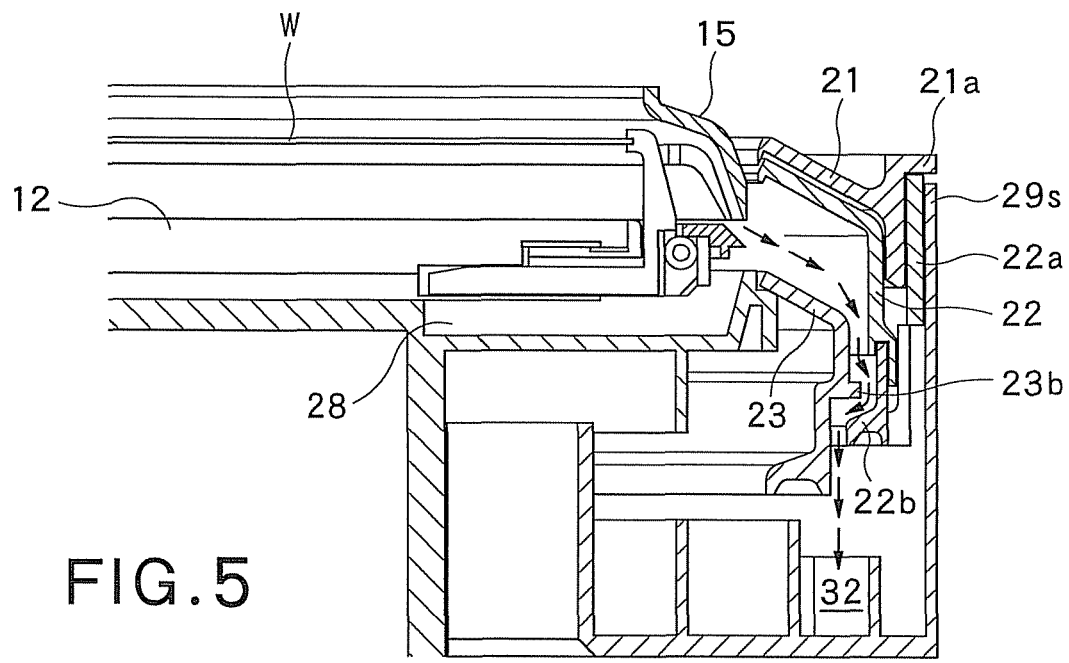
FIG. 5 is a cross-sectional view specifically illustrating the second recovery state corresponding to FIG. 2.

Furthermore, the inner peripheral contact portion 22b also serves as a shelf portion to guide a liquid. As shown in FIG. 5, the shelf portion 22b has a sloped surface (a tapered surface) where the inner periphery is relatively low.

Figure 4:
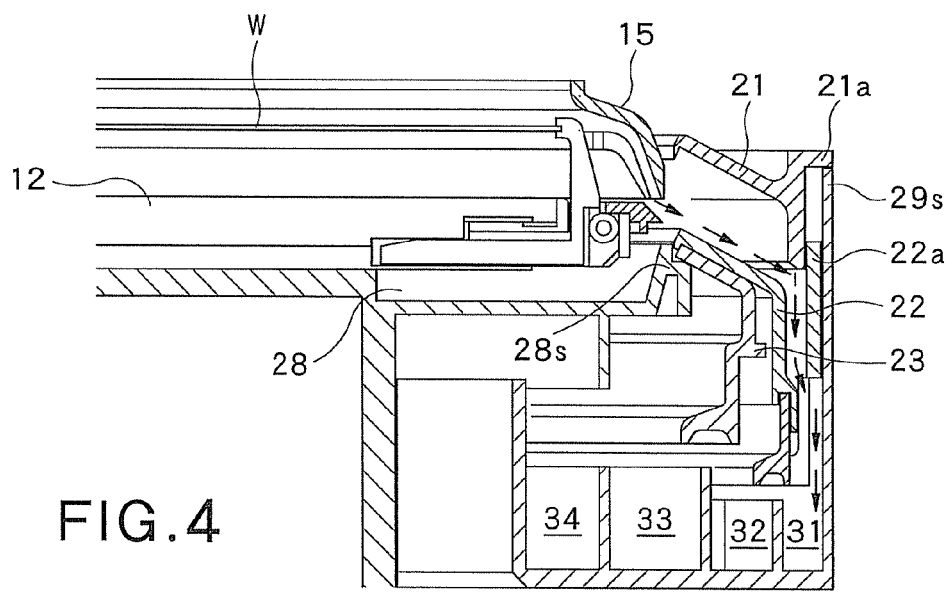
FIG. 4 is a cross-sectional view specifically illustrating the first recovery state corresponding to FIG. 1.

Further, a shelf portion to guide a liquid is also provided at the bottom portion of the lower liquid guide cup 23. As shown in FIG. 4, the shelf portion is also formed as a sloped surface (tapered surface) where the inner periphery thereof is relatively low.

In the configuration described above, the vertical position of the upper liquid guide cup 21, the vertical position of the central liquid guide cup 22, and the vertical position of the lower liquid guide cup 23 are controlled by a control unit 41 to realize the following three recovery states. That is, the control unit 41 is connected to the rotary motor 13 and the up-down movement cylinder 25, and the rotary motor 13 and the up-down movement cylinder 25 are controlled by the control unit 41. Further, the control unit 41 may be configured to select each process-liquid to be supplied to the substrate via the nozzle 14. That is, an acidic liquid, an alkaline liquid and, and an organic liquid are selectively supplied from the nozzle 14 by the control unit 41.

Incidentally, as shown in FIG. 1, the control unit 41 is connected with an input-output unit 42 including a keyboard used to enter a command, or a display used to visually display the operation state of the liquid processing apparatus 10 in order for a process manager or the like to manage the liquid processing apparatus 10. Further, the control unit 41 is configured to access a storage medium 43 storing a program or the like for realizing a process performed in the liquid processing apparatus 10. The storage medium 43 may be configured as a known storage medium, that is, a memory such as a ROM and a RAM, a hard disc, a CD-ROM, a DVD-ROM, and a disc-like storage medium such as a flexible disc. In this manner, the liquid processing apparatus 10 performs a process on the wafer W in a manner such that the control unit 41 executes the program or the like stored in advance on the storage medium 43.

That is, the control unit 41 controls the liquid processing apparatus 10 to realize a first recovery state (FIG. 1) where the, edge of the central liquid guide cup 22 that is near the mist guide cup 15 and the edge of the lower liquid guide cup 23 that is near the mist guide cup 15 are located below the peripheral edge area of the mist guide cup 15 so as to recover a liquid via the gap between the upper liquid guide cup 21 and the central liquid guide cup 22, the second recovery state (FIG. 2) where the edge of the central liquid guide cup 22 that is near the mist guide cup 15 is located above the peripheral edge area of the mist guide cup 15 and the edge of the lower liquid guide cup 23 that is near the mist guide cup 15 is located below the peripheral edge area of the mist guide cup 15 so as to recover a liquid via the gap between the central liquid guide cup 22 and the lower liquid guide cup 23, and the third recovery state (FIG. 3) where the edge of the central liquid guide cup 22 that is near the mist guide cup 15 and the edge of the lower liquid guide cup 23 that is near the mist guide cup 15 are located above the peripheral edge area of the mist guide cup 15 so as to recover a liquid via the lower side of the lower liquid guide cup 23.

Then, the liquid recovered in the first recovery state is guided to a first drain tank 31 that is provided at the outer peripheral areas of the lower area of the upper liquid guide cup 21, the central liquid guide cup 22, and the lower liquid guide cup 23 (FIG. 1).

Further, the liquid recovered in the third recovery state is guided to a third drain tank 33 that is provided at the inner peripheral area of the lower area of the upper liquid guide cup 21, the central liquid guide cup 22, and the lower, liquid guide cup 23 (FIG. 3).

Then, the liquid recovered in the second recovery state is guided to a second drain tank 32 provided between the first drain tank 31 and the third drain tank 33 in the radial direction (FIG. 2).

As shown in FIGS. 1 to 3, the first drain tank 31, the second drain tank 32, and the third drain tank 33 are arranged in series in the radial direction.

In the embodiment, a fourth drain tank 34 is further provided within the range of the inner diameter of the third drain tank 33. Then, the space inside the inner diameter of the fourth drain tank 34 serves as a gas path through which gas is released.

Figure 6:
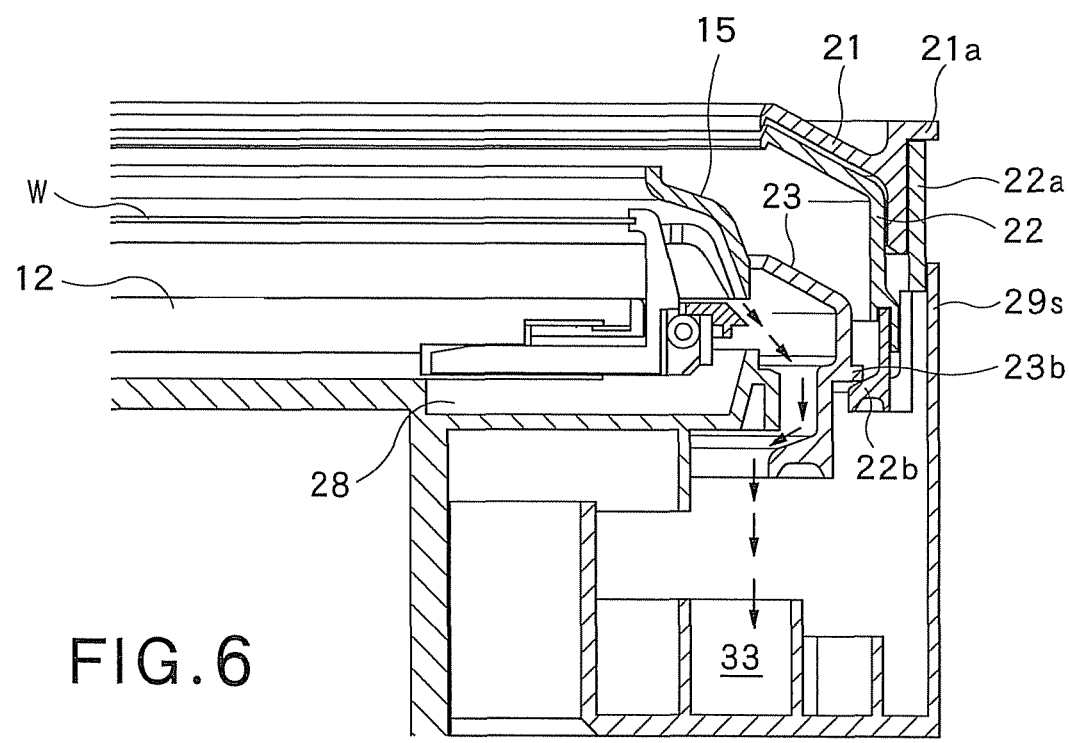
FIG. 6 is a cross-sectional view specifically illustrating the third recovery state corresponding to FIG. 3.

Next, each of the first to third recovery states will be specifically described by referring to FIGS. 4 to 6. First, the first recovery state of FIG. 1 will be specifically described by referring to FIG. 4. In the first recovery state, as shown in FIG. 4, the outer flange 21a of the upper liquid guide cup 21 is supported by the support protrusion 29s so that the edge of the upper liquid guide cup 21 that is near the mist guide cup 15 is located above the peripheral edge area of the mist guide cup 15, and the edge of the central liquid guide cup 22 that is near the mist guide cup 15 and the edge of the lower liquid guide cup 23 that is near the mist guide cup 15 are located below the peripheral edge area of the mist guide cup 15. Accordingly, a liquid (and the mist thereof) is recovered via a gap between the upper liquid guide cup 21 and the central liquid guide cup 22.

Specifically, the liquid (and the mist thereof) passes a gap between the sloped portion of the upper liquid guide cup 21 and the sloped portion of the central liquid guide cup 22 and further passes the outer peripheral area of the vertical portion of the central liquid guide cup 22, so that the liquid reaches the first drain tank 31. In order to ensure the channel of the liquid (and the mist thereof) at the outer peripheral area of the vertical portion of the central liquid guide cup 22, the vertical portion of the central liquid guide cup 22 and the outer peripheral contact Portion 22a are connected at several portions at a predetermined interval in the circumferential direction.

Further, in the first recovery state, as described above, the central liquid guide cup 22 is positioned at the lowest position by the up-down movement cylinder 25. Therefore, so as not to interfere with the central liquid guide cup 22 located at the low position, the height at the inner periphery of the first drain tank 31 is set to be low.

Further, in the first recovery state, as described above, the lower liquid guide cup 23 is supported by the support protrusion 28s provided to the member 28 fixed to the substrate process chamber 11 from the underside thereof. Then, the gap between the central liquid guide cup 22 and the lower liquid guide cup 23 is closed. In this case, the sloped portion of the central liquid guide cup 22 overlaps the sloped portion of the lower liquid guide cup 23, that is, the gap between the central liquid guide cup 22 and the lower liquid guide cup 23 becomes minimal. Accordingly, the space for the vertical movement of each of the cups 21, 22, and 23 is reduced compared to the configuration in which the gap between the central liquid guide cup 22 and the lower liquid guide cup 23 is constant in each of the recovery states. For this reason, the vertical portion of the lower liquid guide cup 23 is prevented from interfering with the drain tank provided at the lower area, suppressing an increase in the entire height of the liquid processing apparatus 10.

Furthermore, in this state, the positioning of the central liquid guide cup 22 may be achieved in a manner such that the sloped portion thereof is supported by the sloped portion of the lower liquid guide cup 23 under the force of gravity, or in a manner of controlling the up-down movement cylinder 25 by the control unit 41.

Next, the second recovery state of FIG. 2 will be specifically described by referring to FIG. 5. In the second recovery state, the edge of the central liquid guide cup 22 that is near the mist guide cup 15 is located above the peripheral edge area of the mist guide cup 15, and the edge of the lower liquid guide cup 23 that is near the mist guide cup 15 is positioned below the peripheral edge area of the mist guide cup 15. Accordingly, a liquid (and mist thereof) is recovered via the gap between the central liquid guide cup 22 and the lower liquid guide cup 23.

Specifically, the liquid (and the mist thereof) passes through the gap between the sloped portion of the central liquid guide cup 22 and the sloped portion of the lower liquid guide cup 23 and further passes the outer peripheral area of the vertical portion of the lower liquid guide cup 23, so that it reaches the second drain tank 32. Since the outer flange 23*b* is provided at the outer peripheral area of the vertical portion of the lower liquid guide cup 23, liquefaction of mist is promoted. Here, although the inner peripheral contact portion 22*b* of the central liquid guide cup 22 is formed as an annular portion protruding toward the inner periphery, liquefaction of mist is further promoted due to the presence of the inner peripheral contact portion 22*b*.

In the second recovery state, as shown in FIG. 5, the outer flange 21*a* of the upper liquid guide cup 21 is pushed upward by the outer peripheral contact portion 22*a* of the central liquid guide cup 22, and the upper liquid guide cup 21 is supported by the central liquid guide cup 22. Then, the gap between the central liquid guide cup 22 and the upper liquid guide cup 21 is closed. In this case, the sloped portion of the central liquid guide cup 22 overlaps the sloped portion of the upper liquid guide cup 21, that is, the gap between the central liquid guide cup 22 and the upper liquid guide cup 21 becomes minimal. Accordingly, the space for the vertical movement of each of the cups 21, 22, and 23 is reduced compared to the configuration in which the gap between the upper liquid guide cup 21 and the central liquid guide cup 22 is constant in each of the recovery states.

In this state, the central liquid guide cup 22 is positioned by the control of the up-down movement cylinder 25 using the control unit 41. Furthermore, the position of the lower liquid guide cup 23 is the same as that of the first recovery state.

Next, the third recovery state of FIG. 3 will be specifically described by referring to FIG. 6. In the third recovery state, the edge of the lower liquid guide cup 23 that is near the mist guide cup 15 is also located above the peripheral edge area of the mist guide cup 15. Accordingly, a liquid (and mist thereof) is recovered via the lower side of the lower liquid guide cup 23.

Specifically, the liquid (and the mist thereof) passes the lower side of the sloped portion of the lower liquid guide cup 23 and further passes the inner peripheral area of the vertical portion of the lower liquid guide cup 23, so that it reaches the third drain tank 33. As shown in FIG. 6, when an annular portion is provided at the lower end of the vertical portion of the lower liquid guide cup 23 so as to protrude toward the inner periphery, liquefaction of mist is promoted by the annular portion.

In the third recovery state, as shown in FIG. 6, the outer flange 21*a* of the upper liquid guide cup 21 is pushed upward by the outer peripheral contact portion 22*a* of the central liquid guide cup 22 up to a position higher than that of the second recovery state, so that the upper liquid guide cup 21 is supported by the central liquid guide cup 22. Then, the gap between the central liquid guide cup 22 and the upper liquid guide cup 21 is closed. In this case, the sloped portion of the central liquid guide cup 22 overlaps with the sloped portion of the upper liquid guide cup 21, that is, the gap between the central liquid guide cup 22 and the upper liquid guide cup 21 becomes minimal. Accordingly, the space for the vertical movement of each of the cups 21, 22, and 23 is reduced compared to the configuration in which the gap between the upper liquid guide cup 21 and the central liquid guide cup 22 is constant in each of the recovery states.

Furthermore, in the third recovery state, as shown in FIG. 6, the outer flange 23*b* of the lower liquid guide cup 23 is pushed upward by the inner peripheral contact portion 22*b* of the central liquid guide cup 22 up to a position higher than that of the second recovery state, so that the lower liquid guide cup 23 is supported by the central liquid guide cup 22. At this time, although the gap between the sloped portion of the central liquid guide cup 22 and the sloped portion of the lower liquid guide cup 23 is larger than that of the second recovery state (FIG. 5), the effect obtained by minimizing the gap between the central liquid guide cup 22 and the upper liquid guide cup 21 is large. For this reason, the space for the vertical movement of each of the cups 21, 22, and 23 is reduced as a whole.

In this state, the central liquid guide cup 22 is positioned by the control of the up-down movement cylinder 25 using the control unit 41.

In particular, since the organic liquid is highly volatile, it is desirable that the process is performed in the first recovery state to prevent an atmosphere from moving to the other cup.

In the actual liquid process, it is desirable that the organic liquid is recovered in the first drain tank 31, the acidic liquid is recovered in the second drain tank 32, and the alkaline liquid is recovered in the third drain tank 33. The fourth drain tank 34 may be used to recover the mixture of various liquids, for example, when the placement table 12 rotates at a low speed.

According to the embodiment with the above-described configuration, when the organic liquid is supplied to the substrate, the organic liquid scattering from the substrate may be guided by the upper liquid guide cup 21 to be recovered in the first drain tank 31. In the same manner, when the acidic liquid is supplied to the substrate, the acidic liquid scattering from the substrate may be guided by the central liquid guide cup 22 to be recovered in the second drain tank 32. Also, when the alkaline liquid is supplied to the substrate, the scattering alkaline liquid may be guided by the lower liquid guide cup 23 to be recovered in the third drain tank 33. That is, the liquid scattering from the substrate may be guided to the corresponding cup by appropriately moving up and down the upper liquid guide cup 21, the central liquid guide cup 22, and the lower liquid guide cup 23 in accordance with the type of the liquid supplied to the substrate. Accordingly, the mist of three types or more of process-liquids may be separately recovered with high efficiency.

Further, the central liquid guide cup 22 and the lower liquid guide cup 23 are closed in the first recovery state, and the upper liquid guide cup 21 and the central liquid guide cup 22 are closed in the second recovery state and the third recovery state. Accordingly, the space for the vertical moving of each of the cups 21, 22, and 23 is reduced compared to the configuration in which the gap between the upper liquid guide cup 21 and the central liquid guide cup 22 and the gap between the central liquid guide cup 22 and the lower liquid guide cup 23 are constant in each of the recovery states. Further, tanks 31 to 34 are provided at the lower area of the upper liquid guide cup 21, the central liquid guide cup 22, and the lower liquid guide cup 23 to recover the liquid guided by the corresponding cup and temporarily store the liquid therein. By adopting such an arrangement relationship, the liquid once liquefied may be suppressed from becoming mist again. Further, since the tanks 31 to 34 are arranged in series in the radial direction, a liquid guide drain pipe may be easily connected to each of the tanks 31 to 34. Furthermore, a path for releasing a gas throwing off from the substrate may be easily designed.

Further, as described above, the inner peripheral side partition wall of the first drain tank 31, that is, the height of the partition wall between the first drain tank 31 and the second drain tank 32 is set to be lower than the height of the partition wall between the second drain tank 32 and the third drain tank 33. Accordingly, the partition wall between the first drain tank 31 and the second drain tank 32 may be prevented from interfering with the central liquid guide cup 22, and a degree of freedom in design of each cup structure may be improved.

Furthermore, in the embodiment, the gap between the central liquid guide cup 22 and the lower liquid guide cup 23 in the third recovery state is set to be longer than that of the second recovery state, but the present invention is not limited thereto. For example, the gap between the central liquid guide cup 22 and the lower liquid guide cup 23 in the third recovery state may be set to be shorter than that of the second recovery state. Even in this case, the same effect as that of the above-described embodiment may be substantially obtained.

(Second Embodiment)

Next, a substrate liquid processing apparatus of a second embodiment of the present invention will be described by referring to FIGS. 7 to 11. In the second embodiment shown in FIGS. 7 to 11, the primary difference is that the first guide cup located at the upper position is fixed.

Figure 7:
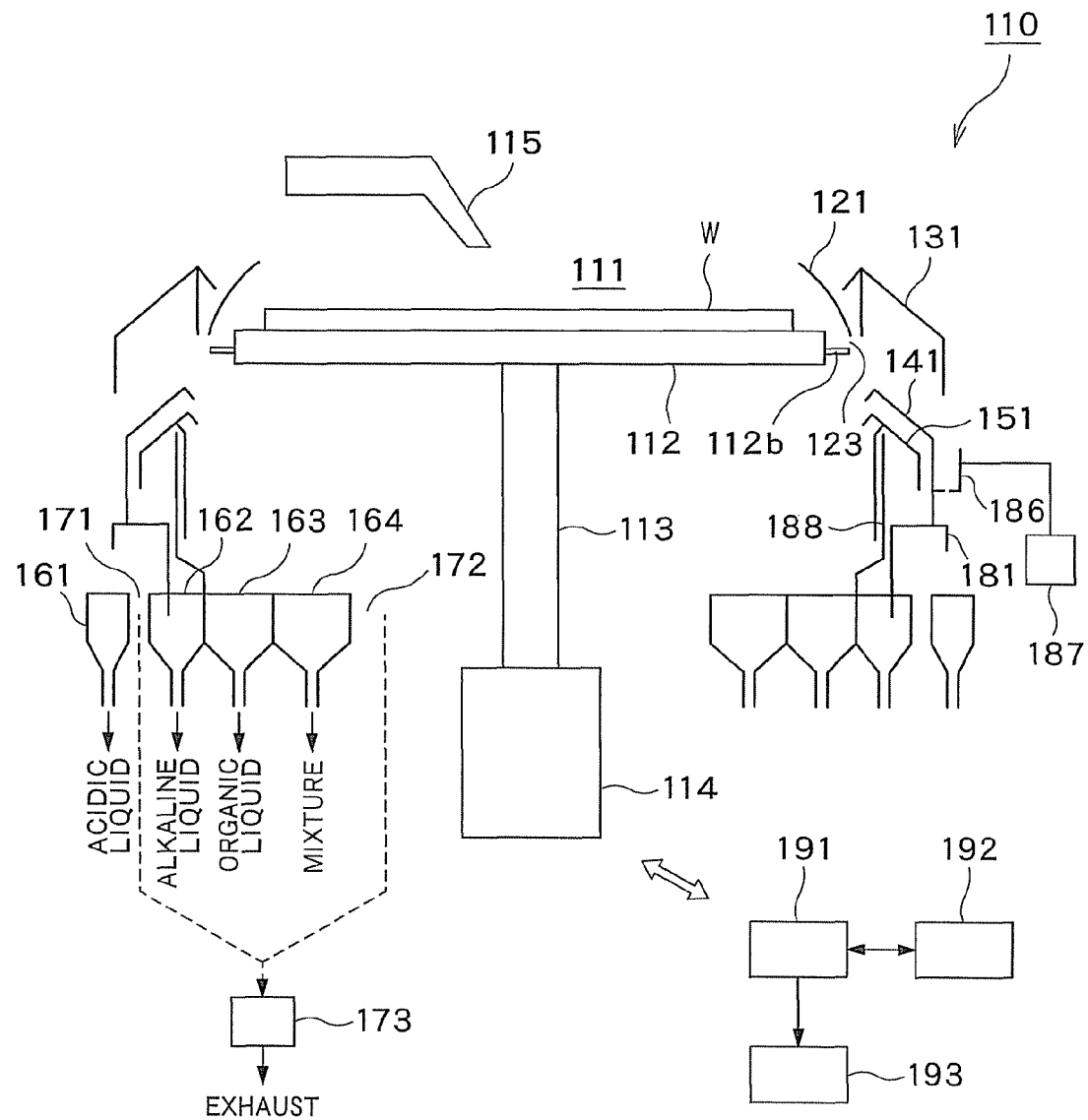
FIG. 7 is a configuration diagram schematically illustrating a substrate liquid processing apparatus according to a second embodiment of the present invention.
Figure 8:
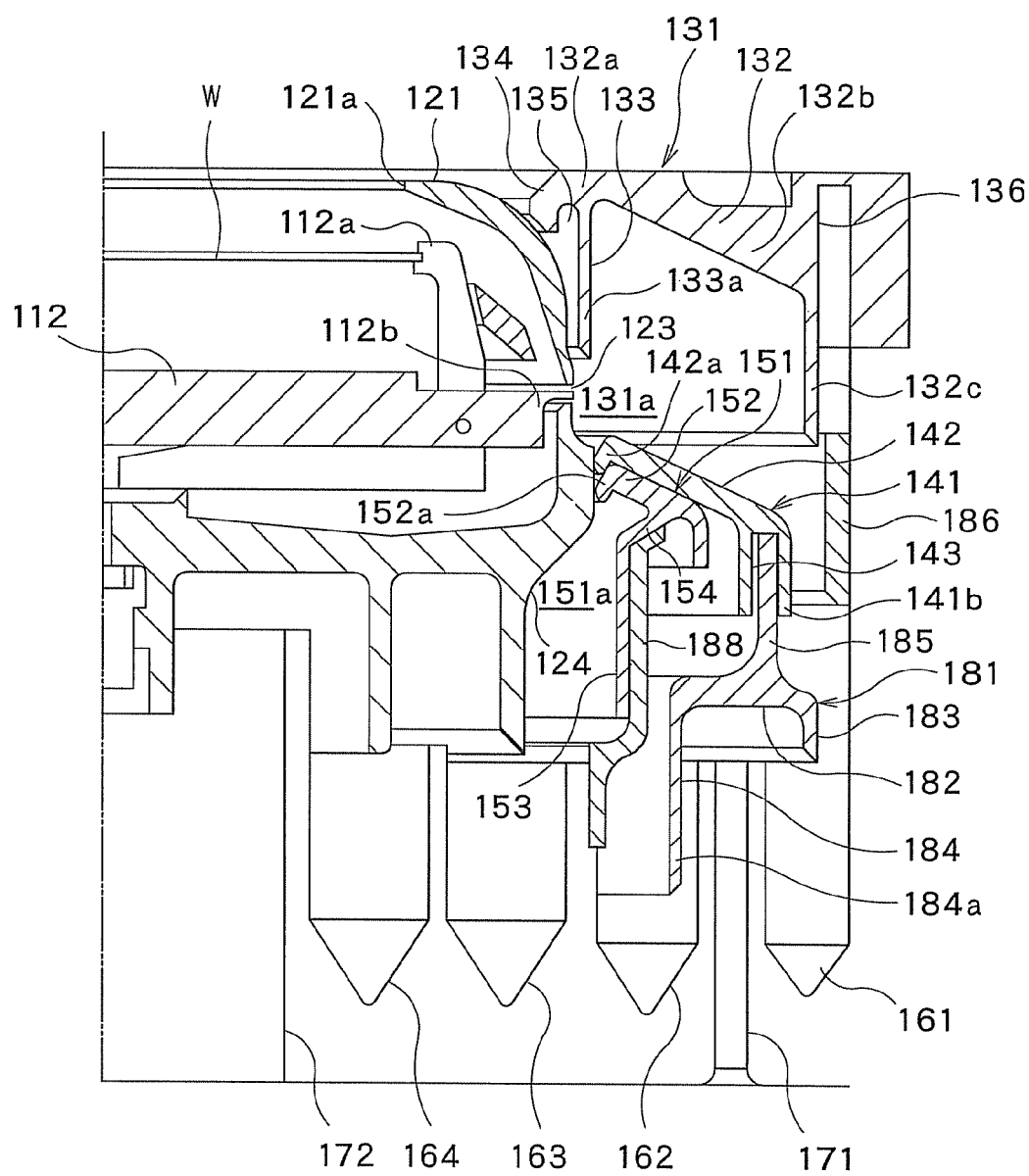
FIG. 8 is a cross-sectional view specifically illustrating the substrate liquid processing apparatus during an acidic process of the second embodiment of the present invention.

As shown in FIGS. 7 and 8, a substrate liquid processing apparatus 110 includes a single-wafer-type liquid processing chamber 111 and a substrate holding table 112. A substrate (for example, a semiconductor wafer, and hereinafter, simply referred to as a wafer W) is loaded into and unloaded from the single water type liquid processing chamber 111 one by one so that the substrate can be processed in the single-water-type liquid processing chamber 111. The substrate holding table 112 is provided inside the liquid processing chamber 111 in a freely rotatable manner and holds the wafer W thereon. The substrate holding table 112 is connected with a rotary motor (a rotary driving unit) 114 configured to rotate the substrate holding table 112 via a rotary driving shaft 113. The wafer W is held by a holding member 112a at the peripheral edge portion of the substrate holding table 112, and rotates within a horizontal plane by driving the rotary motor 114.

The liquid processing chamber 111 is provided with a nozzle (a process-liquid supply unit) 115 which selectively ejects (supplies) a plurality of types of process-liquids to the wafer W held by the substrate holding table 112. That is, the nozzle 115 is selectively connected with a supply source (not shown) of an acidic process-liquid, an alkaline process-liquid, a rinse process-liquid, and an organic process-liquid, and selectively ejects the process-liquids onto the surface of the wafer W. Furthermore, as the acidic process-liquid, for example, an SPM solution (a solution obtained by mixing sulfuric acid with hydrogen peroxide water), an HF solution (hydrogen fluoride), an SC2 solution (a solution obtained by mixing hydrochloric acid with hydrogen peroxide water), or the like may be used. As the alkaline process-liquid, for example, an SC1 solution (ammonia hydrogen peroxide mixture), ammonia water, or the like may be used. Further, as the rinse process-liquid, for example, pure water or the like may be used. As the organic process-liquid, for example, an IPA solution (an isopropyl alcohol solution) or the like may be used.

A guide rotary cup 121 is provided around the substrate holding table 112 to rotate together with the substrate holding table 112 and guide the process-liquid scattering from the rotating wafer W or mist thereof. The guide rotary cup 121 has an upper opening 121a, and is formed in an annular shape as a whole. In regard to the guide rotary cup 121, the diameter of the opening of the lower end portion is larger than that of an upper opening 121a, and the vertical cross-section thereof is in the shape of an upward convex curve. That is, as shown in FIG. 8, the guide rotary cup 121 is formed in a manner of extending outward from its upper peripheral edge of the wafer W in the radial direction of the wafer W.

The substrate holding table 112 includes an outer peripheral end portion 112b which extends toward the lower side of the guide rotary cup 121. A gap portion 123 is present between the outer peripheral end portion 112b and the lower end portion of the guide rotary cup 121, and the process-liquid that scatters from the wafer W and is guided by the guide rotary cup 121 is guided further outside the guide rotary cup 121 via the gap portion 123.

As shown in FIG. 8, a holding table lower member 124 is provided below the substrate holding table 112. The holding table lower member 124 is fixed to the liquid processing chamber 111, and is configured to further guide downward the process-liquid guided by a third guide cup 151 to be described later and an atmosphere around the wafer W at that time.

A first guide cup (a guide cup) 131, a second guide cup 141, and a third guide cup 151 are provided in this order from the top around the guide rotary cup 121 to guide downward the corresponding process-liquids guided by the guide rotary cup 121.

Among these, the first guide cup 131 guides the acidic process-liquid, the second guide cup 141 guides the alkaline process-liquid, and the third guide cup 151 guides the organic process-liquid. Furthermore, the first guide cup 131 may guide the alkaline process-liquid, and the second guide cup 141 may guide the acidic process-liquid. Further, each of the guide cups 131, 141, and 151 is formed in an annular shape as a whole, the first guide cup 131 is fixed to the liquid processing chamber 111, and the second guide cup 141 is connected to an up-down movement cylinder 187 to be described later to be able to be freely moved up and down with respect to the first guide cup 131. The third guide cup 151 is configured to be able to be freely moved up and down together with the second guide cup 141 in a partial range of the up-down movement range of the second guide cup 141.

The first guide cup 131 includes a first guide cup body (a guide cup body) 132 and a first downward extension portion (a downward extension portion) 133 extending downward from an inner peripheral end portion 132a of the first guide cup body 132. Among these, the first guide cup body 132 includes a sloped portion 132b extending obliquely downward and outward and a vertical portion 132c extending downward in the vertical direction from the outer peripheral end portion of the sloped portion 132b, and guides downward the acidic process-liquid. Furthermore, the inner peripheral end portion 132a of the first guide cup body 132 is located above the outer peripheral end portion area of the guide rotary cup 121. Further, a lower end portion 133a of a first downward extension portion 133 is disposed adjacent to and above the gap portion 123. In this manner, the first downward extension portion 133 prevents the stream of the process-liquid from the gap portion 123 from being interrupted, and covers the outer peripheral portion (the portion near the first guide cup 131) of the guide rotary cup 121. The first downward extension portion 133 is configured to close an opening 131a of the first guide cup 131 when the alkaline process-liquid is guided by the second guide cup 141 (see FIG. 10). Furthermore, the first downward extension portion 133 is configured to close an opening 141a of the second guide cup 141 when the organic process-liquid is guided by the third guide cup 151 (see FIG. 11). At this time, the gap between the first guide cup 131 and the second guide cup 141 is blocked.

Here, the "closing" does not mean a concept of perfect sealing of an opening but means a concept of closing most of the opening, allowing a clearance to the extent that can be considered to be able to prevent the process-liquid or the like from flowing into the opening. In the same manner, the "blocking" does not mean of a concept of perfect sealing of a gap between two guide cups but means a concept of allowing two guide cups to be closer to each other, with a clearance therebetween to the extent that can be considered to be able to prevent the process-liquid or the like from flowing through the gap.

An inner peripheral extension portion 134 extends inward from the inner peripheral end portion 132a of the first guide cup body 132 more than the first downward extension portion 133. Then, a gas guide space 135 is formed by the first downward extension portion 133, the inner peripheral extension portion 134, and the guide rotary cup 121. The gas guide space 135 is used to guide downward a gas turning by the rotation of the guide rotary cup 121. That is, although the gas inside the gas guide space 135 turns along the first downward extension portion 133 due to the centrifugal force exerted thereon, the turning gas is guided downward along the first downward extension portion 133 since the inner peripheral extension portion 134 is provided at the upper portion of the gas guide space 135. Furthermore, in the embodiment, the inner peripheral extension portion 134 extends downward from the guide rotary cup 121 along the first downward extension portion 133, and the cross-section from the inner peripheral extension portion 134 to the first downward extension portion 133 is formed in a reverse U-shape. Further, although the distal end of the inner peripheral extension portion 134 is adjacent to the outer peripheral surface of the guide rotary cup 121, a predetermined clearance is present between the front end of the inner peripheral extension portion 134 and the outer peripheral surface of the guide rotary cup 121 so as to prevent an interference therebetween. Further, an up-down moving groove 136 is formed in the outer peripheral end portion of the first guide cup body 132, and a connection member 186 to be described later is provided in the up-down moving groove 136 to be able to be moved up and down.

Figure 10:
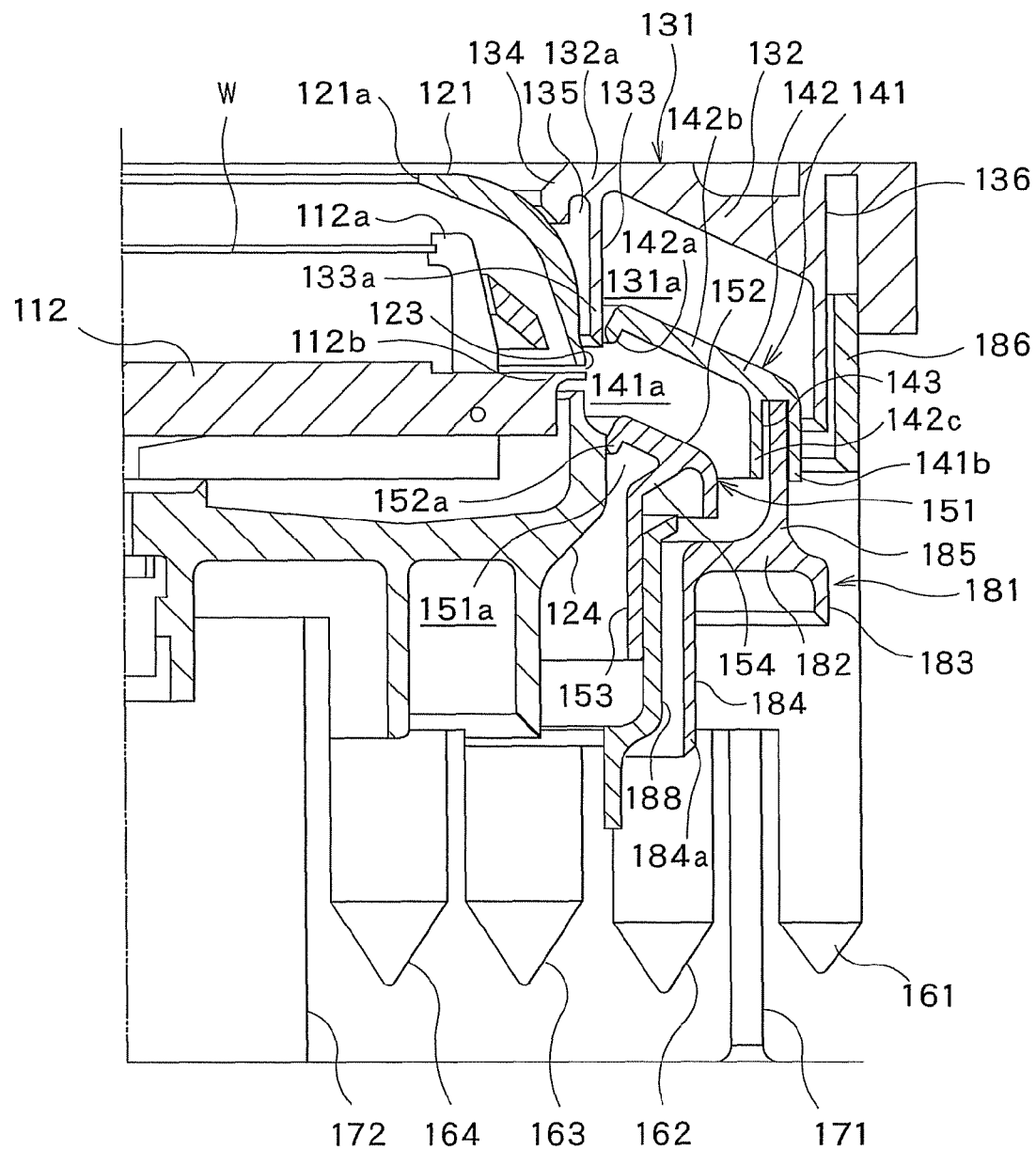
FIG. 10 is a cross-sectional view specifically illustrating the substrate liquid processing apparatus during an alkaline process of the second embodiment of the present invention.

As shown in FIG. 10, the second guide cup 141 includes a second guide cup body 142 and a fitting groove 143 to which a fitting portion 185 of a guide member 181 to be described later is fitted. Among these, the second guide cup body 142 includes a sloped portion 142b extending obliquely downward and outward and a vertical portion 142c extending downward in the vertical direction from the outer peripheral end portion of the sloped portion 142b, and guides downward the alkaline process-liquid. An inner peripheral end portion 142a of the second guide cup body 142 is disposed at the outer periphery more than the first downward extension portion 133 of the first guide cup 131, the vertical portion 142c of the second guide cup body 142 is disposed at the inner periphery more than the vertical portion 132c of the first guide cup body 132, and the second guide cup 141 is configured to be able to be moved up and down in a space between the first downward extension portion 133 and the vertical portion 132c of the first guide cup body 132. Further, the fitting groove 143 is formed in the vertical portion 142c of the second guide cup body 142.

Figure 11:
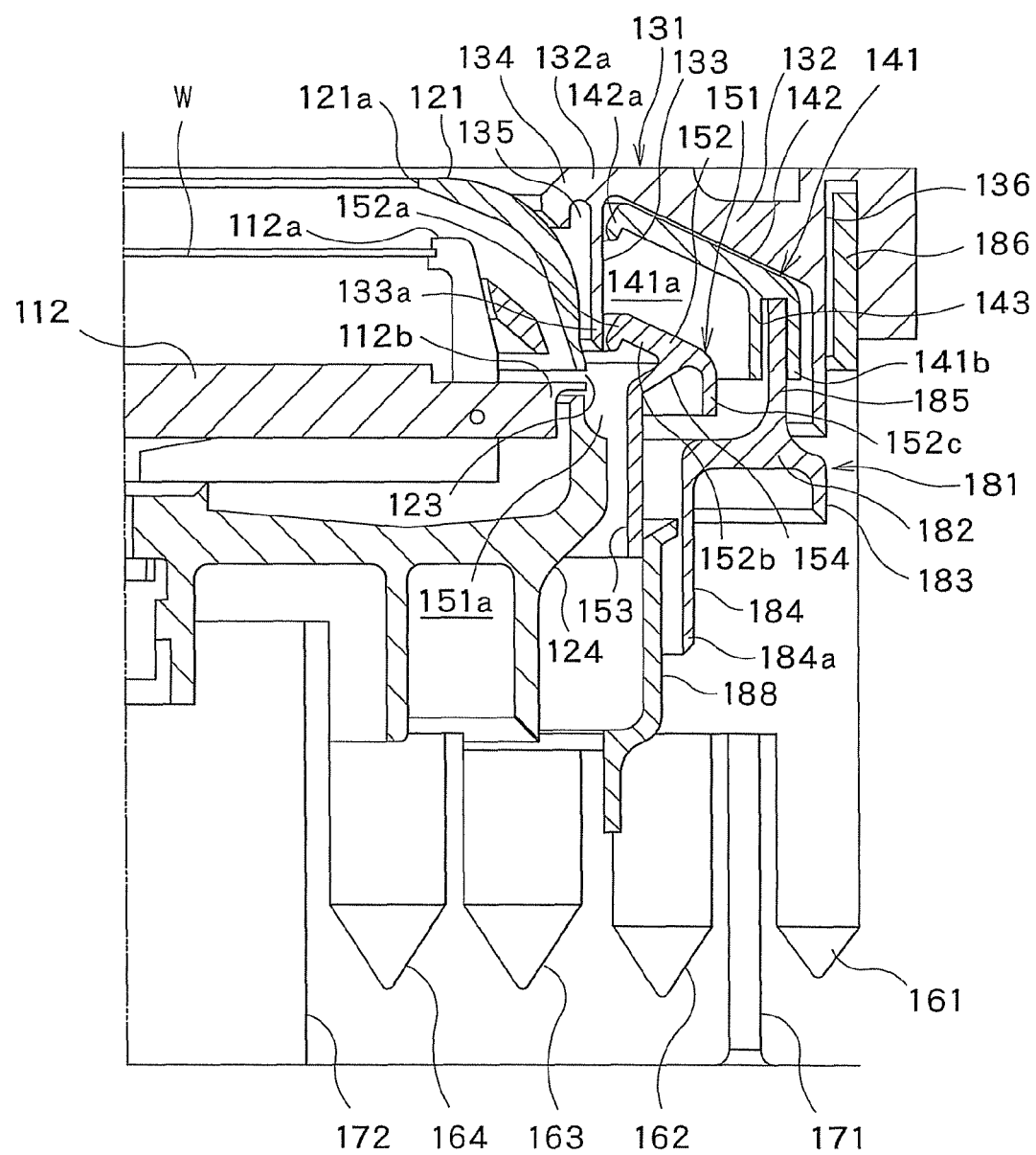
FIG. 11 is a cross-sectional view specifically illustrating the substrate liquid processing apparatus during a drying process of the second embodiment of the present invention.
Figure 12:
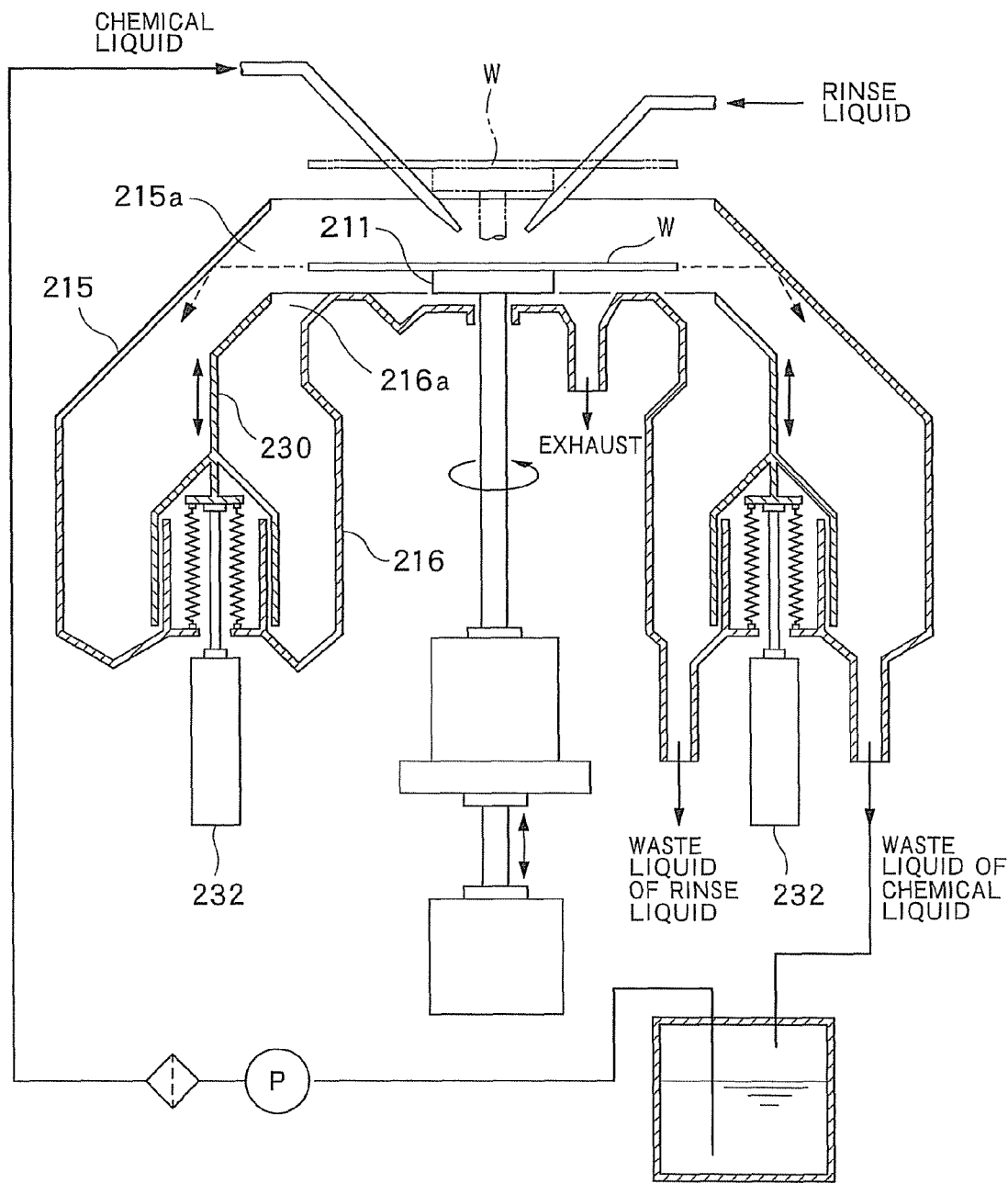
FIG. 12 is a cross-sectional view schematically illustrating an existing liquid processing apparatus.

As shown in FIG. 11, the third guide cup 151 includes a third guide cup body 152 and a third downward extension portion 153 connected to the third guide cup body 152 via a contact portion 154 to extend downward. Among these, the third guide cup body 152 includes a sloped portion 152b extending obliquely downward and outward and a vertical portion 152c extending downward in the vertical direction from the outer peripheral end portion of the sloped portion 152b. The vertical portion 152c is disposed at the inner periphery more than the vertical portion 142c of the second guide cup body 142, and the inner peripheral end portion 152a of the third guide cup body 152 is disposed at the outer periphery more than the first downward extension portion 133 of the first guide cup 131 and the holding table lower member 124. The third downward extension portion 153 is connected to the sloped portion 152b of the third guide cup body 152 via the inclined contact portion 154, and is configured to guide downward the organic process-liquid together with the sloped portion 152b and the contact portion 154. Further, the third downward extension portion 153 is configured to be able to slide along a defining wall 188 to be described later. The contact portion 154 is configured to freely come into contact with the upper end portion of the defining wall 188 (see FIG. 8), and when the contact portion 154 comes into contact with the upper end portion of the defining wall 188, the third guide cup 151 is supported by the defining wall 188.

Figure 9:
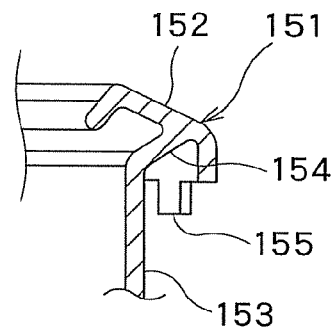
FIG. 9 is a diagram illustrating a third guide cup in the substrate liquid processing apparatus of the second embodiment of the present invention.

As shown in FIG. 9, the outer peripheral end portion (the vertical portion 152c) of the third guide cup body 152 is provided with a protrusion 155 which freely comes into contact with a guide member body 182 of a guide member 181 to be described later. A plurality of the protrusions 155 are provided at several positions at a predetermined interval therebetween in the circumferential direction. The third guide cup 151 is supported by the second guide cup 141 in a manner such that each protrusion 155 comes into contact with the guide member body 182. Then, when the third guide cup 151 is supported by the second guide cup 141, the second guide cup 141 is moved up and down together with the third guide cup 151. Further, when the third guide cup 151 is not supported by the second guide cup 141, that is, when the third guide cup 151 is supported by the defining wall 188, the second guide cup 141 is moved up and down independently from the third guide cup 151. That is, the third guide cup 151 is configured to be moved up and down together with the second guide cup 141 in a partial range of the up-down movement range of the second guide cup 141.

As shown in FIGS. 7 and 8, the outer periphery of the lower area of the first guide cup 131, the second guide cup 141, and the third guide cup 151 is provided with a first process-liquid recovery tank 161 that recovers the acidic process-liquid guided by the first guide cup 131. The inner periphery of the first process-liquid recovery tank 161 is provided with a second process-liquid recovery tank 162 that recovers the alkaline process-liquid guided by the second guide cup 141. The inner periphery of the second process-liquid recovery tank 162 is provided with a third process-liquid recovery tank 163 that recovers the organic process-liquid guided by the third guide cup 151. Furthermore, the inner periphery of the third process-liquid recovery tank 163 is provided with a fourth process-liquid recovery tank 164 that recovers the mixture of the process-liquids when the substrate holding table 112 rotates at a low speed.

A first exhaust member (an exhaust member) 171 is provided between the first process-liquid recovery tank 161 and the second process-liquid recovery tank 162 to discharge an atmosphere around the wafer W via the first guide cup 131 and the second guide cup 141. It is desirable that the first exhaust member 171 has an annular planar cross-section and is provided to be coaxial with respect to each of the process-liquid recovery tanks 161 to 164. Further, a second exhaust member 172 is provided at the inner periphery of the fourth process-liquid recovery tank 164 to discharge an atmosphere around the wafer W via the third guide cup 151. The first exhaust member 171 and the second exhaust member 172 are integrally formed with each other at the downstream of the exhaust direction so that the exhaust from each of the exhaust members 171 and 172 merges. Further, the first exhaust member 171 and the second exhaust member 172 are connected to a suction driving unit 173 that suctions the contents in the interior of the first exhaust member 171 and in the interior of the second exhaust member 172.

A lower end portion 141b of the second guide cup 141 is provided with the guide member 181 that guides the process-liquid from the first guide cup 131 to the first process-liquid recovery tank 161 and guides the process-liquid from the second guide cup 141 to the second process-liquid recovery tank 162. The guide member 181 is formed in an annular shape as a whole to cover the upper side of the first exhaust member 171, and has a U-shaped cross-section that is open toward the first exhaust member 171. That is, the guide member 181 includes the guide member body 182 extending in the radial direction, an outer peripheral wall portion 183 extending downward from the outer peripheral end portion of the guide member body 182, and an inner peripheral wall portion 184 provided at the inner periphery more than the outer peripheral wall portion 183 and extending downward from the inner peripheral end portion of the guide member body 182. Among these, the outer peripheral wall portion 183 is disposed at a position corresponding to the first process-liquid recovery tank 161, that is, a position above the first process-liquid recovery tank 161. The inner peripheral wall portion 184 is disposed at a position corresponding to the second process-liquid recovery tank 162, and is located above the second process-liquid recovery tank 162 in the state shown in FIG. 11. Further, it is desirable that the inner peripheral wall portion 184 extends downward more than the outer peripheral wall portion 183 and a lower end portion 184a of the inner peripheral wall portion 184 is inserted into the second process-liquid recovery tank 162 during the alkaline process as shown in FIG. 10. Accordingly, when the alkaline process-liquid is guided, the alkaline process-liquid may be reliably guided to the second process-liquid recovery tank 162. Further, the fitting portion 185 extends upward from the guide member body 182, and the fitting portion 185 is configured to be fitted to the fitting groove 143 provided at the lower portion of the second guide cup 141.

A substrate liquid processing apparatus 110 includes the up-down movement cylinder (a position adjustment mechanism, an up-down movement driving unit) 187 adjusting a positional relationship between the guide cups 131, 141, and 151 and the substrate holding table 112. The up-down movement cylinder 187 of the embodiment is configured to move up and down the second guide cup 141 and the third guide cup 151 with respect to the first guide cup 131 fixed to the liquid processing chamber 111. As shown in FIGS. 7 and 8, the up-down movement cylinder 187 is connected to the guide member body 182 via the connection member 186. The connection member 186 is configured to be slidable inside the up-down moving groove 136 of the first guide cup 31. In this manner, the second guide cup 141 is connected to the up-down movement cylinder 187 via the guide member 181, and is configured to move up and down with respect to the first guide cup 131. Furthermore, the connection member 186 and the guide member body 182 are connected at several portions with a predetermined interval in the circumferential direction, and prevents the stream of the acidic process-liquid or the like guided by the first guide cup 131 from being intercepted.

As shown in FIG. 8, the substrate liquid processing apparatus 110 includes the defining wall 188 that defines a passage from the second guide cup 141 to the second process-liquid recovery tank 162 and a passage from the third guide cup 151 to the third process-liquid recovery tank 163. The defining wall 188 is provided to extend upward through a space between the third downward extension portion 153 of the third guide cup 151 and the guide member 181 provided in the second guide cup body 142, from a position of a gap between the second process-liquid recovery tank 162 and the third process-liquid recovery tank 163. As described above, the third downward extension portion 153 of the third guide cup 151 is slidable along the defining wall 188 and is in contact with the defining wall 188 so that a gap between the defining wall 188 and the third downward extension portion 153 may be blocked when the third guide cup 151 moves upward to perform the drying process (refer to FIG. 11) and when the third guide cup 151 moves downward to perform the acidic process (refer to FIG. 8). Further, as described above, the upper end portion of the defining wall 188 is configured to freely come into contact with the contact portion 154 of the third guide cup 151.

As shown in FIG. 7, a control unit 191 is connected to the rotary motor 114 and the up-down movement cylinder 187. The rotary motor 114 and the up-down movement cylinder 187 are controlled by the control unit 191. Further, the control unit 191 is configured to select each process-liquid to be ejected onto the wafer W via the nozzle 115. That is, the acidic process-liquid is ejected from the nozzle 115 by the control unit 191 during the acidic process of the wafer W, the alkaline process-liquid is ejected from the nozzle 115 during the alkaline process of the wafer W, the rinse process-liquid is ejected from the nozzle 115 during the rinse process of the wafer W, and the organic process-liquid is ejected from the nozzle 115 during the drying process of the wafer W.

Incidentally, as shown in FIG. 7, the control unit 191 is connected with an input-output unit 192 including a keyboard used to enter a command and a display used to visually display the operation state of the substrate liquid processing apparatus 110 in order for a process manager or the like to manage the substrate liquid processing apparatus 110. Further, the control unit 191 is configured to be able to access a storage medium 193 storing a program or the like for realizing a process performed in the substrate liquid processing apparatus 110. The storage medium 193 may be configured as a known storage medium, that is, a memory such as a ROM and a RAM, a hard disc, a CD-ROM, a DVD-ROM, and a disc-like storage medium such as a flexible disc. In this manner, the substrate liquid processing apparatus 110 performs a process on the wafer W in a manner such that the control unit 191 executes the program or the like stored in advance on the storage medium 193.

Next, the operation of the embodiment with such a configuration, that is, a method of processing a substrate with a process-liquid according to the embodiment will be described. Furthermore, the operation of each component for performing the method of processing a substrate with a process-liquid, which is to be described below, is controlled by a control signal output from the control unit 191 based on a program stored in advance on the storage medium 193.

First, as shown in FIGS. 7 and 8, the wafer W is loaded into the liquid processing chamber 111, and is held at the substrate holding table 112 by the holding member 112a.

Subsequently, the substrate holding table 112 holding the wafer W is rotationally driven by the rotary motor 114 together with the guide rotary cup 121 or the like. Accordingly, the wafer W held by the substrate holding table 112 rotates within the horizontal plane.

Next, the acidic process is performed on the wafer W by using the acidic process-liquid. In this case, the acidic process-liquid is supplied from a supply source (not shown) of the acidic process-liquid to the nozzle 115, and is ejected onto the surface of the rotating wafer W.

In this case, as shown in FIG. 8, the opening 131a of the first guide cup 131 is disposed at a position corresponding to the gap portion 123 between the guide rotary cup 121 and the outer peripheral end portion 112b of the substrate holding table 112. Accordingly, the acidic process-liquid with mist scattering from the wafer W, which is guided by the guide rotary cup 121, flows through the opening 131a of the first guide cup 131.

The acidic process-liquid flowing to the opening 131a of the first guide cup 131 is guided by the sloped portion 132b and the vertical portion 132c of the first guide cup body 132, and is recovered in the first process-liquid recovery tank 161 via the outer peripheral side of the outer peripheral wall portion 183 of the guide member 181. In this case, since the outer peripheral wall portion 183 of the guide member 181 is disposed above the first process-liquid recovery tank 161, the acidic process-liquid may be reliably guided to the first process-liquid recovery tank 161. Further, liquefaction of mist of the acidic process-liquid may be promoted by the guide member 181. Furthermore, since the suction driving unit 173 is driven, an atmosphere around the wafer W is guided in the same manner as the acidic process-liquid, and is discharged by the first exhaust member 171.

During the acidic process, the sloped portion 142b of the second guide cup body 142 overlaps the sloped portion 152b of the third guide cup body 152, so that the gap between the second guide cup 141 and the third guide cup 151 is blocked. Further, the inner peripheral end portion 152a of the third guide cup body 152 is close to the outer peripheral surface of the holding table lower member 124, and the opening 151a of the third guide cup 151 is closed. Accordingly, the acidic process-liquid passing the gap portion 123 may be suppressed from flowing to the second guide cup 141 and the third guide cup 151.

Further, since the guide rotary cup 121 rotates during the acidic process, the gas inside the gas guide space 135 turns along the first downward extension portion 133 due to the centrifugal force exerted thereon. The turning gas is guided downward along the first downward extension portion 133 since the upper portion of the gas guide space 135 is provided with the inner peripheral extension portion 134. In this case, since the stream of the gas from the gas guide space 135 into the first guide cup 131 is generated, the mist of the acidic process-liquid may be prevented from moving upward via a gap between the first guide cup 131 and the guide rotary cup 121. Further, since the first downward extension portion 133 extends from the inner peripheral end portion 132a of the first guide cup body 132 to the vicinity of the gap portion 123, the mist of the acidic process-liquid thrown off from the wafer W and rebounding from the inner surface of the first guide cup body 132 collides with the outer peripheral surface of the first downward extension portion 133 to be liquefied and moves downward along the first downward extension portion 133. Furthermore, even when the mist of the acidic process-liquid rebounding from the inner surface of the first guide cup body 132 adheres to the inner peripheral surface of the first downward extension portion 133, the adhering acidic process-liquid moves downward along the first downward extension portion 133 since there is the stream of the gas from the gas guide space 135 to the first guide cup 131.

After the completion of the acidic process of the wafer W, the rinse process is performed on the wafer W. In this case, the rinse process-liquid is supplied from a supply source (not shown) of the rinse process-liquid to the nozzle 115, and is ejected onto the surface of the rotating wafer W. In the meantime, the rinse process-liquid scattering from the wafer W is recovered in the first process-liquid recovery tank 161 in the same manner as in the process of the acidic process-liquid, and an atmosphere around the wafer W is discharged by the first exhaust member 171.

Next, the up-down movement cylinder 187 is driven, so that the second guide cup 141 and the third guide cup 151 move upward. In this case, first, the second guide cup 141 moves upward independently from the third guide cup 151. Subsequently, the protrusion 155 of the third guide cup 151 comes into contact with the guide member body 182 of the guide member 181, so that the third guide cup 151 is supported by the second guide cup 141. Then, the second guide cup 141 moves upward together with the third guide cup 151 until the opening 141a of the second guide cup 141 faces the gap portion 123. In this manner, each of the guide cups 131, 141, and 151 is disposed in a manner shown in FIG. 10. In this case, although the sloped portion 132b of the first guide cup body 132 and the sloped portion 142b of the second guide cup body 142 is away from each other, the lower end portion 133a of the first downward extension portion 133 of the first guide cup 131 is close to the inner peripheral end portion 142a of the second guide cup body 142, and the opening 131a of the first guide cup 131 is closed by the first downward extension portion 133. Further, the inner peripheral end portion 152a of the third guide cup body 152 is close to the outer peripheral surface of the holding table lower member 124, and the opening 151a of the third guide cup 151 is closed. Further, at this time, the lower end portion 184a of the inner peripheral wall portion 184 of the guide member 181 is still inserted in the second process-liquid recovery tank 172.

Subsequently, the alkaline process is performed on the wafer W by using the alkaline process-liquid. In this case, the alkaline process-liquid is supplied from a supply source (not shown) of the alkaline process-liquid to the nozzle 115, and is ejected onto the surface of the rotating wafer W.

As shown in FIG. 10, the alkaline process-liquid flowing to the opening 141a of the second guide cup 141 is guided by the second guide cup body 142, and is recovered in the second process-liquid recovery tank 162 via a gap between the inner peripheral wall portion 184 of the guide member 181 and the defining wall 188. In this case, since the lower end portion 184a of the inner peripheral wall portion 184 of the guide member 181 is inserted in the second process-liquid recovery tank 162, the alkaline process-liquid may be reliably guided to the second process-liquid recovery tank 162. Further, liquefaction of mist of the alkaline process-liquid may be promoted by the guide member 181. Furthermore, since the suction driving unit 173 is driven, an atmosphere around the wafer W is guided in the same manner as the alkaline process-liquid, and is discharged by the first exhaust member 171.

During the alkaline process, the alkaline process-liquid with mist scattering from the wafer W, which is guided by the guide rotary cup 121, flows to the opening 141a of the second guide cup 141. At this time, since the opening 131a of the first guide cup 131 and the opening 151a of the third guide cup 151 are closed, the alkaline process-liquid passing the gap portion 123 may be suppressed from flowing to the first guide cup 131 and the third guide cup 151.

Further, since the vertical positional relationship between the guide rotary cup 121 and the first guide cup 131 during the alkaline process is the same as that of the acidic process, a gas guide space 135 is formed in the same manner as in the acidic process. For this reason, a stream of a gas from the gas guide space 135 into the second guide cup 141 is generated.

After the completion of the alkaline process of the wafer W, the rinse process is performed on the wafer W. In this case, the rinse process-liquid is supplied from a supply source (not shown) of the rinse process-liquid to the nozzle 115, and is ejected onto the surface of the rotating wafer W. In the meantime, the rinse process-liquid scattering from the wafer W is recovered in the second process-liquid recovery tank 162 in the same manner as in the alkaline process-liquid, and an atmosphere around the wafer W is discharged by the first exhaust member 171.

Next, the up-down movement cylinder 187 is driven, so that the second guide cup 141 and the third guide cup 151 move upward. In this case, the second guide cup 141 moves upward together with the third guide cup 151 while the third guide cup 151 is supported by the second guide cup 141 until the opening 151a of the third guide cup 151 faces the gap portion 123. In this manner, each of the guide cups 131, 141, and 151 is disposed in a manner shown in FIG. 11. In this case, the sloped portion 132b of the first guide cup body 132 overlaps the sloped portion 142b of the second guide cup body 142, so that the gap between the first guide cup 131 and the second guide cup 141 is blocked. Further, although the sloped portion 142b of the second guide cup body 142 and the sloped portion 152b of the third guide cup body 152 are away from each other, the lower end portion 133a of the first downward extension portion 133 of the first guide cup 131 is close to the inner peripheral end portion 152a of the third guide cup body 152 and the opening 141a of the second guide cup 141 is closed.

Subsequently, the drying process is performed on the wafer W by using the organic process-liquid. In this case, the organic process-liquid is supplied from a supply source (not shown) of the organic process-liquid to the nozzle 115, and is ejected onto the surface of the rotating wafer W.

The organic process-liquid flowing to the opening 151a of the third guide cup 151 is guided by the sloped portion 152b of the third guide cup body 152, the contact portion 154, and the third downward extension portion 153, and is recovered in the third process-liquid recovery tank 163 via a gap between the defining wall 188 and the holding table lower member 124. Further, since the suction driving unit 173 is driven, an atmosphere around the wafer W is guided in the same manner as in the organic process-liquid, and is discharged by the second exhaust member 172 via the upper side of the third process-liquid recovery tank 163 and the upper side of the fourth process-liquid recovery tank 164.

During the drying process, the gap between the first guide cup 131 and the second guide cup 141 is blocked, and the opening 141a of the second guide cup 141 is closed. Accordingly, the organic process-liquid passing the gap portion 123 may be suppressed from flowing to the first guide cup 131 and the second guide cup 141.

Further, since the vertical positional relationship between the guide rotary cup 121 and the first guide cup 131 during the drying process is the same as that of the acidic process, a guide space 135 is formed in the same manner as in the acidic process. For this reason, a stream of a gas from the gas guide space 135 into the third guide cup 151 is generated.

In this manner, the process of the wafer W is completed. Subsequently, the wafer W is removed from the substrate holding table 112 and is unloaded from the liquid processing chamber 111.

Subsequently, when the unprocessed wafer W is loaded and the acidic process is performed on the wafer W, the up-down movement cylinder 187 is driven, so that the second guide cup 141 and the third guide cup 151 move downward. In this case, first, the second guide cup 141 moves downward together with the third guide cup 151, and the contact portion 154 of the third guide cup 151 comes into contact with the upper end portion of the defining wall 188. Accordingly, the third guide cup 151 is supported by the defining wall 188. Subsequently, the second guide cup 141 further moves downward independently from the third guide cup 151, and the opening 131a of the first guide cup 131 faces the gap portion 123. In this case, the inner peripheral end portion 152a of the third guide cup body 152 is close to the outer peripheral surface of the holding table lower member 124, and the opening 151a of the third guide cup 151 is closed. Further, the second guide cup body 142 overlaps the third guide cup body 152, so that the gap between the second guide cup 141 and the third guide cup 151 is blocked. In this manner, each of the guide cups 131, 141, and 151 is disposed in a manner shown in FIG. 8. At this time, the lower end portion 184a of the inner peripheral wall portion 184 of the guide member 181 is inserted into the second process-liquid recovery tank 162.

Likewise, according to the embodiment, the guide member 181 is provided at the lower end portion 141b of the second guide cup 141. Accordingly, the acidic process-liquid guided by the first guide cup 131 may be suppressed from directly flowing to the first exhaust member 171, and the acidic process-liquid may be guided to the first process-liquid recovery tank 161. Further, the alkaline process-liquid guided by the second guide cup 141 may be suppressed from directly flowing to the first exhaust member 171, and the alkaline process-liquid may be guided to the second process-liquid recovery tank 162. Further, since the outer peripheral wall portion 183 of the guide member 181 is located above the first process-liquid recovery tank 161, the acidic process-liquid guided by the first guide cup 131 may be reliably guided to the first process-liquid recovery tank 161 by the outer peripheral wall portion 183 of the guide member 181. Further, since the lower end portion 184a of the inner peripheral wall portion 184 of the guide member 181 is inserted in the second process-liquid recovery tank 162 during the alkaline process, the alkaline process-liquid guided by the second guide cup 141 may be reliably guided to the second process-liquid recovery tank 162. For this reason, the recovery rate of each process-liquid scattering from the wafer W may be improved.

According to the embodiment, during the acidic process of the wafer W, the gap between the second guide cup 141 and the third guide cup 151 is blocked, and the opening 151a of the third guide cup 151 is closed since the inner peripheral end portion 152a of the third guide cup body 152 is close to the holding table lower member 124. Accordingly, the acidic process-liquid may be guided by the first guide cup 131 to be reliably recovered in the first process-liquid recovery tank 161. Further, during the alkaline process of the wafer W, the opening 131a of the first downward extension portion 133 of the first guide cup 131 is closed and the inner peripheral end portion 152a of the third guide cup body 152 is close to the holding table lower member 124, so that the opening 151a of the third guide cup 151 is closed. Accordingly, the alkaline process-liquid may be guided by the second guide cup 141 to be reliably recovered in the second process-liquid recovery tank 162. Furthermore, during the drying process of the wafer W, the gap between the first guide cup 131 and the second guide cup 141 is blocked, and the first downward extension portion 133 of the first guide cup 131 closes the opening 141a of the second guide cup 141. Accordingly, the organic process-liquid may be guided by the third guide cup 151 to be reliably recovered in the third process-liquid recovery tank 163. For this reason, the recovery rate of each process-liquid scattering from the wafer W may be improved.

Furthermore, according to the embodiment, the defining wall 188 is provided between the guide member 181 provided in the second guide cup 141 and the third downward extension portion 153 of the third guide cup 151. Accordingly, the alkaline process-liquid guided by the second guide cup 141 may be prevented from flowing to the third process-liquid recovery tank 163, and the organic process-liquid guided by the third guide cup 151 may be prevented from flowing to the second process-liquid recovery tank 162. For this reason, the recovery rate of each process-liquid scattering from the wafer W may be improved.

According to the embodiment, during the acidic process, the gas inside the gas guide space 135 is guided downward along the first downward extension portion 133 while turning by the centrifugal force exerted thereon due to the rotation of the guide rotary cup 121. Accordingly, a stream of a gas may be generated from the gas guide space 135 to the first guide cup 131. In particular, since the cross-section from the inner peripheral extension portion 134 to the first downward extension portion 133 is formed in a reverse U-shape, the gas inside the gas guide space 135 may be reliably guided into the first guide cup 131. Further, since the first guide cup 131 is fixed to the liquid processing chamber 111, the vertical positional relationship between the guide rotary cup 121 and the first guide cup 131 during the alkaline process and the drying process is maintained in said relationship during the acidic process. Accordingly, the stream of the gas may be generated from the gas guide space 135 to the second guide cup 141 even during the alkaline process, and the stream of the gas may be generated from the gas guide space 135 to the third guide cup 151 during the drying process. For this reason, each process-liquid may be prevented from moving upward via the gap between the first guide cup 131 and the guide rotary cup 121. As a result, each process-liquid scattering from the wafer W may be prevented from adhering to the wafer W again, and the production of particle may be controlled. Further, in this case, the process-liquids may be reliably guided to the corresponding process-liquid recovery tanks 161, 162, and 163 via the corresponding guide cups 131, 141, and 151. For this reason, the recovery rate of each process-liquid may be improved.

According to the embodiment, the first downward extension portion 133 extends from the inner peripheral end portion 132a of the first guide cup body 132 to the vicinity of the gap portion 123.

Accordingly, the acidic process-liquid thrown off from the wafer W and rebounding from the inner surface of the first guide cup body 132 may be liquefied by colliding with the outer peripheral surface of the first downward extension portion 133 and then thus move downward. For this reason, even the acidic process-liquid rebounding from the inner surface of the first guide cup body 132 may be guided to the first process-liquid recovery tank 161 via the first guide cup 131.

While the embodiments of the present invention have been described and illustrated above, those may be, of course, modified into various forms within the scope of the concept of the present invention. Hereinafter, representative modified examples will be described.

Further, in the embodiment, an example has been described in which the guide member 181 has a U-shaped cross-section that is open toward the first exhaust member 171. However, not limited thereto, the guide member 181 may have a flat-plate-like cross-section covering the upper side of the first exhaust member 171. Even in this case, the recovery rate of each process-liquid may be improved.

Further, in the embodiment, an example of a three-stage cup structure including the first guide cup 131, the second guide cup 141, and the third guide cup 151 has been described. However, not limited thereto, the present invention may be applied to a configuration of a two-stage cup structure including only the first guide cup 131 and the second guide cup 141 or a configuration of a single-stage cup structure including only the first guide cup 131.

In the embodiment, an example has been described in which the third guide cup 151 is moved up and down together with the second guide cup 141 in a partial range of an up-down movement range of the second guide cup 141. However, not limited thereto, the second guide cup 141 may be configured to be moved up and down together with the third guide cup 151 on every occasion.

Further, in the embodiment, an example has been described in which the first guide cup 131 is fixed to the liquid processing chamber 111, and the second guide cup 141 and the third guide cup 151 are moved up and down with respect to the first guide cup 131 by the up-down movement cylinder 187. However, not limited thereto, the up-down movement cylinder 187 may be configured to move up and down the first guide cup 131, the second guide cup 141, and the third guide cup 151. Further, the substrate holding table 112 may be configured to be moved up and down while each of the guide cups 131, 141, and 151 is not moved up and down but fixed. Even in this case, each process-liquid scattering from the wafer W may be guided to the corresponding guide cups 131, 141, and 151, and the recovery rate of each process-liquid may be improved due to the guide member 181. Incidentally, in this case, it is desirable that the first guide cup 131 does not have the first downward extension portion 133.

That is, in the embodiment, an example has been described in which the inner peripheral extension portion 134 of the first guide cup 131 extends from the inner peripheral end portion 132a of the first guide cup body 132 toward the guide rotary cup 121 and the cross-section from the inner peripheral extension portion 134 to the first downward extension portion 133 is formed in a reverse U-shape. However, not limited thereto, the inner peripheral extension portion 134 may be formed in an arbitrary shape as long as the inner peripheral extension portion 134 extends inward more than the first downward extension portion 133 of the first guide cup 131 and guides downward the gas inside the gas guide space 135 while the guide rotary cup 121 rotates.

Furthermore, in the description above, an example has been described in which the substrate liquid processing apparatus, the method of processing a substrate with a process-liquid, and the storage medium storing the computer program for performing the method of processing a substrate with a process-liquid are applied to the cleaning process of the semiconductor wafer W. However, the present invention is not limited thereto and may be also applied to cleaning processes of various substrates such as an LCD substrate or a CD substrate.

The invention claimed is:

1. A substrate liquid processing apparatus comprising:
a substrate holding table configured to hold a substrate;
a rotary driving unit configured to rotate the substrate holding table;
a process-liquid supply unit configured to selectively supply a plurality of types of process-liquids to the substrate held by the substrate holding table;
first and second guide cups which are provided around the substrate holding table and are disposed in this order from the top, the first and second guide cups being configured to respectively guide downward the process-liquid scattering from the rotating substrate while being held by the substrate holding table;
a position adjustment mechanism configured to adjust a positional relationship between the first and second guide cups and the substrate holding table;
a first process-liquid recovery tank provided at a lower area of the first and second guide cups, the first process-liquid recovery tank being configured to recover the process-liquid guided by the first guide cup;
a second process-liquid recovery tank provided at an inner peripheral side of the first process-liquid recovery tank, the second process-liquid recovery tank being configured to recover the process-liquid guided by the second guide cup;
a guide member provided at the lower end portion of the second guide cup, the guide member being configured to guide the process-liquid from the first guide cup to the first process-liquid recovery tank and guide the process-liquid from the second guide cup to the second process-liquid recovery tank;
a first exhaust member provided between the first process-liquid recovery tank and the second process-liquid recovery tank, the first exhaust member being configured to discharge an atmosphere around the substrate via an opening of the first guide cup and an opening of the second guide cup;
a third guide cup provided below the second guide cup, the third guide cup being configured to guide the process-liquid scattering from the rotating substrate while being held by the substrate holding table;
a third process-liquid recovery tank provided at an inner peripheral side of the second process-liquid recovery tank, the third process-liquid recovery tank being configured to recover the process-liquid guided by the third guide cup;
a second exhaust member provided at an inner peripheral side of the third process-liquid recovery tank, the second exhaust member being configured to discharge the atmosphere around the substrate via the third guide cup; and
a defining wall configured to define a passage from the second guide cup to the second process-liquid recovery tank and a passage from the third guide cup to the third process-liquid recovery tank;
wherein the guide member covers an upper side of the first exhaust member,
the third guide cup includes a third guide cup body, and a third guide cup downward extension portion extending downward from the third guide cup body,
the defining wall is provided between the guide member and the third guide cup downward extension portion, the defining wall is in contact with the third guide cup downward extension portion and the third guide cup downward extension portion slides along the defining wall during a movement of the third guide cup to block any gap that may be formed between the third guide cup downward extension portion and the defining wall during the movement of the third guide cup, and
the defining wall defines a passage for discharging the atmosphere around the substrate via the first and second guide cup by the first exhaust member and a passage for discharging the atmosphere around the substrate via the third guide cup by the second exhaust member.

2. The substrate liquid processing apparatus according to claim 1,
wherein the guide member includes a guide member body, an outer peripheral wall portion extending downward from the guide member body, and an inner peripheral wall portion provided at an inner peripheral side of the outer peripheral wall portion and extending downward from the guide member body; and
the outer peripheral wall portion is disposed at a position corresponding to the first process-liquid recovery tank, and the inner peripheral wall portion is disposed at a position corresponding to the second process-liquid recovery tank.

3. The substrate liquid processing apparatus according to claim 2,
wherein the position adjustment mechanism is configured to move up and down the second guide cup with respect to the first guide cup,
the inner peripheral wall portion extends downward more than the outer peripheral wall portion, and
the lower end portion of the inner peripheral wall portion is inserted into the second process-liquid recovery tank when the process-liquid is guided by the second guide cup.

4. The substrate liquid processing apparatus according to claim 3, wherein the first guide cup includes a first guide cup body and a first guide cup downward extension portion extending downward from the inner peripheral end portion of the first guide cup body, and the first guide cup downward extension portion closes an opening of the first guide cup when the process-liquid is guided by the second guide cup.

5. The substrate liquid processing apparatus according to claim 4, wherein he third guide cup is configured to be moveable up and down together with the second guide cup, and when the process-liquid is guided by the third guide cup, a gap between the first guide cup and the second guide cup is blocked, and the first guide cup downward extension portion closes an opening of the second guide cup.

6. The substrate liquid processing apparatus according to claim 1, wherein the first process-liquid recovery tank, the first exhaust member, the second process-liquid recovery tank, and the third process-liquid recovery tank have an annular planar cross-section and are coaxially provided.

7. The substrate liquid processing apparatus according to claim 2, wherein the guide member body extends outward and inward from the vertical portion of the second guide cup.

8. The substrate liquid processing apparatus according to claim 7, wherein the outer peripheral wall portion extends downward from the outer peripheral end portion of the guide member body, and the inner peripheral wall portion extends downward from the inner peripheral end portion of the guide member body.

9. The substrate liquid processing apparatus according to claim 8, wherein the inner peripheral wall portion extends downward more than the outer peripheral wall portion.

10. The substrate liquid processing apparatus according to claim 1, further comprising a holding table lower member provided below the substrate holding table, the holding table lower member including downward protrusion portion configured to guide downward the process-liquid guided by the third guide cup.

11. The substrate liquid processing apparatus according to claim 10, further comprising a fourth process-liquid recovery tank provided at an inner peripheral side of the third process-liquid recovery tank, the fourth process-liquid recovery tank being configured to recover the process-liquid.

12. The substrate liquid processing apparatus according to claim 1, further comprising a fourth process-liquid recovery tank provided at an inner peripheral side of the third process-liquid recovery tank, the fourth process-liquid recovery tank being configured to recover the process-liquid.

\* \* \* \* \*